United States Patent
Weman et al.

(10) Patent No.: US 11,257,967 B2
(45) Date of Patent: Feb. 22, 2022

(54) SOLAR CELLS

(71) Applicant: NORWEGIAN UNIVERSITY OF SCIENCE AND TECHNOLOGY (NTNU), Trondheim (NO)

(72) Inventors: Helge Weman, Ecublens (CH); Bjørn-Ove Fimland, Trondheim (NO); Dong Chul Kim, Trondheim (NO)

(73) Assignee: Norwegian University of Science and Technology (NTNU), Trondheim (NO)

( * ) Notice: Subject to any disclaimer, the term of this patent is extended or adjusted under 35 U.S.C. 154(b) by 0 days.

(21) Appl. No.: 16/504,868

(22) Filed: Jul. 8, 2019

(65) Prior Publication Data
US 2020/0105952 A1    Apr. 2, 2020

Related U.S. Application Data

(63) Continuation of application No. 14/409,837, filed as application No. PCT/EP2013/063071 on Jun. 21, 2013, now Pat. No. 10,347,781.

(30) Foreign Application Priority Data

Jun. 21, 2012  (GB) ..................... 1211038

(51) Int. Cl.
*H01L 31/0352* (2006.01)
*H01L 31/0304* (2006.01)
(Continued)

(52) U.S. Cl.
CPC ............ *H01L 31/035227* (2013.01); *H01L 31/022466* (2013.01); *H01L 31/022475* (2013.01);
(Continued)

(58) Field of Classification Search
CPC ..... H01L 31/035227; H01L 31/022466; H01L 31/022475; H01L 31/022483;
(Continued)

(56) References Cited

U.S. PATENT DOCUMENTS

| 4,213,801 A | 7/1980 | Johnston |
| 7,335,908 B2 | 2/2008 | Samuelson et al. |

(Continued)

FOREIGN PATENT DOCUMENTS

| CN | 101504961 A | 8/2009 |
| CN | 101710567 A | 5/2010 |

(Continued)

OTHER PUBLICATIONS

Cohin, et al., "Growth of Vertical GaAs Nanowires or an Amorphous Substrate via a Fiber-Textured Si Platform", Nano Letters, 2013, 2743.

(Continued)

*Primary Examiner* — Lindsey A Bernier
(74) *Attorney, Agent, or Firm* — Meunier Carlin & Curfman LLC

(57) ABSTRACT

A composition of matter, in particular a photovoltaic cell, comprising: at least one core semiconductor nanowire on a graphitic substrate, said at least one core nanowire having been grown epitaxially on said substrate wherein said nanowire comprises at least one group III-V compound or at least one group II-VI compound or at least one group IV element; a semiconductor shell surrounding said core nanowire, said shell comprising at least one group III-V compound or at least one group II-VI compound or at least one group IV element such that said core nanowire and said shell form a n-type semiconductor and a p-type semicon- (Continued)

ductor respectively or vice versa; and an outer conducting coating surrounding said shell which forms an electrode contact.

14 Claims, 10 Drawing Sheets

(51) Int. Cl.
*H01L 31/18* (2006.01)
*H01L 31/0224* (2006.01)

(52) U.S. Cl.
CPC .. *H01L 31/022483* (2013.01); *H01L 31/0304* (2013.01); *H01L 31/035281* (2013.01); *H01L 31/184* (2013.01); *H01L 31/1804* (2013.01); *H01L 31/1828* (2013.01); *H01L 31/1852* (2013.01)

(58) Field of Classification Search
CPC ......... H01L 31/0304; H01L 31/035281; H01L 31/184; H01L 31/1852
See application file for complete search history.

(56) References Cited

U.S. PATENT DOCUMENTS

| | | | |
|---|---|---|---|
| 7,442,575 B2 | 10/2008 | Coffer et al. | |
| 7,594,982 B1* | 9/2009 | Roscheisen | H01L 31/1884 |
| | | | 136/263 |
| 7,608,147 B2 | 10/2009 | Samuelson et al. | |
| 7,608,472 B2 | 10/2009 | Ichinose et al. | |
| 7,911,035 B2 | 3/2011 | Seifert et al. | |
| 7,965,960 B2 | 6/2011 | Kim et al. | |
| 8,043,942 B2 | 10/2011 | Lee et al. | |
| 8,212,335 B2 | 7/2012 | Fujioka | |
| 8,417,153 B2 | 4/2013 | Kim et al. | |
| 8,440,350 B1 | 5/2013 | Verbrugge et al. | |
| 8,455,284 B2 | 6/2013 | Seong et al. | |
| 8,916,850 B2 | 12/2014 | Yi et al. | |
| 9,577,176 B1 | 2/2017 | Fong et al. | |
| 9,666,673 B2 | 5/2017 | Yi et al. | |
| 10,243,104 B2 | 3/2019 | Weman et al. | |
| 2002/0175408 A1 | 11/2002 | Majumdar et al. | |
| 2003/0044608 A1 | 3/2003 | Yoshizawa et al. | |
| 2004/0075464 A1 | 4/2004 | Samuelson et al. | |
| 2005/0217565 A1 | 10/2005 | Lahreche et al. | |
| 2006/0054909 A1 | 3/2006 | Shin et al. | |
| 2006/0125056 A1 | 6/2006 | Samuelson et al. | |
| 2006/0188774 A1 | 8/2006 | Niu et al. | |
| 2007/0177138 A1 | 8/2007 | Esmaeili | |
| 2007/0177139 A1 | 8/2007 | Kamins et al. | |
| 2007/0212538 A1 | 9/2007 | Niu | |
| 2007/0240757 A1* | 10/2007 | Ren | H01L 31/1085 |
| | | | 136/256 |
| 2008/0036038 A1 | 2/2008 | Hersee et al. | |
| 2008/0081439 A1 | 4/2008 | Coffer et al. | |
| 2008/0118999 A1 | 5/2008 | Komada | |
| 2008/0142066 A1 | 6/2008 | Plissonnier et al. | |
| 2008/0142926 A1 | 6/2008 | Seifert et al. | |
| 2008/0191317 A1 | 8/2008 | Cohen et al. | |
| 2009/0057649 A1 | 3/2009 | Sutter et al. | |
| 2009/0159907 A1 | 6/2009 | Wang | |
| 2009/0176159 A1 | 7/2009 | Zhamu et al. | |
| 2009/0191317 A1 | 7/2009 | Lin | |
| 2009/0200540 A1 | 8/2009 | Bjoerk et al. | |
| 2009/0235862 A1 | 9/2009 | Cha et al. | |
| 2009/0293946 A1 | 12/2009 | Lin et al. | |
| 2010/0029037 A1 | 2/2010 | Tokuda et al. | |
| 2010/0035412 A1 | 2/2010 | Samuelson et al. | |
| 2010/0155702 A1 | 6/2010 | Wernersson et al. | |
| 2010/0171096 A1 | 7/2010 | Sutter et al. | |
| 2010/0200839 A1 | 8/2010 | Okai et al. | |
| 2010/0252808 A1 | 10/2010 | Samuelson et al. | |
| 2010/0314617 A1 | 12/2010 | Ito et al. | |
| 2010/0320445 A1 | 12/2010 | Ogihara et al. | |
| 2010/0327258 A1 | 12/2010 | Lee et al. | |
| 2011/0030772 A1* | 2/2011 | Veerasamy | H01L 31/03923 |
| | | | 136/256 |
| 2011/0030991 A1 | 2/2011 | Veerasamy et al. | |
| 2011/0081500 A1 | 4/2011 | Zhao et al. | |
| 2011/0121264 A1 | 5/2011 | Choi et al. | |
| 2011/0129675 A1 | 6/2011 | Choi et al. | |
| 2011/0133061 A1 | 6/2011 | Yu et al. | |
| 2011/0148284 A1 | 6/2011 | Nagao et al. | |
| 2011/0163292 A1 | 7/2011 | Wang et al. | |
| 2011/0168256 A1 | 7/2011 | Wang et al. | |
| 2011/0174626 A1 | 7/2011 | Hamada et al. | |
| 2011/0175059 A1 | 7/2011 | Kahen et al. | |
| 2011/0177683 A1 | 7/2011 | Kahen et al. | |
| 2011/0203651 A1 | 8/2011 | Nagao et al. | |
| 2011/0220171 A1 | 9/2011 | Mathai et al. | |
| 2011/0220864 A1 | 9/2011 | Kim et al. | |
| 2011/0239932 A1 | 10/2011 | Chang et al. | |
| 2011/0240099 A1 | 10/2011 | Ellinger et al. | |
| 2011/0254034 A1 | 10/2011 | Konsek et al. | |
| 2011/0272723 A1 | 11/2011 | Ha et al. | |
| 2011/0313194 A1 | 12/2011 | Lee et al. | |
| 2012/0021554 A1 | 1/2012 | Neel et al. | |
| 2012/0041246 A1 | 2/2012 | Scher et al. | |
| 2012/0056237 A1 | 3/2012 | Choi et al. | |
| 2012/0068122 A1 | 3/2012 | Kranbuehl et al. | |
| 2012/0068153 A1 | 3/2012 | Seong et al. | |
| 2012/0068157 A1 | 3/2012 | Kub et al. | |
| 2012/0087422 A1 | 4/2012 | Zhou et al. | |
| 2012/0090057 A1 | 4/2012 | Cohen et al. | |
| 2012/0132930 A1 | 5/2012 | Young et al. | |
| 2012/0135158 A1 | 5/2012 | Freer et al. | |
| 2012/0141799 A1 | 6/2012 | Kub et al. | |
| 2012/0145549 A1 | 6/2012 | Cho et al. | |
| 2012/0192931 A1 | 8/2012 | Jeon et al. | |
| 2012/0211073 A1 | 8/2012 | Nagao et al. | |
| 2012/0241192 A1 | 9/2012 | Cai et al. | |
| 2012/0270054 A1 | 10/2012 | Hong et al. | |
| 2013/0026468 A1 | 1/2013 | Yoshimuta et al. | |
| 2013/0137220 A1 | 5/2013 | Matsubara et al. | |
| 2013/0153860 A1 | 6/2013 | Kim et al. | |
| 2013/0158322 A1 | 6/2013 | Nyce et al. | |
| 2013/0187128 A1 | 7/2013 | Yi et al. | |
| 2013/0207075 A1 | 8/2013 | Myers et al. | |
| 2013/0213470 A1 | 8/2013 | Yi et al. | |
| 2013/0221322 A1 | 8/2013 | Ohlsson et al. | |
| 2013/0221385 A1 | 8/2013 | Shibata et al. | |
| 2013/0231470 A1 | 9/2013 | Iacobelli | |
| 2013/0280894 A1 | 10/2013 | Lee et al. | |
| 2013/0311363 A1 | 11/2013 | Ramaci | |
| 2013/0334497 A1 | 12/2013 | Weman et al. | |
| 2014/0014171 A1 | 1/2014 | Alam et al. | |
| 2014/0077156 A1 | 3/2014 | Bavencove et al. | |
| 2014/0151826 A1 | 6/2014 | Kelber et al. | |
| 2014/0161730 A1 | 6/2014 | Sitharaman et al. | |
| 2014/0182668 A1 | 7/2014 | Pacifici et al. | |
| 2014/0231745 A1 | 8/2014 | Northrup et al. | |
| 2014/0252316 A1 | 9/2014 | Yan et al. | |
| 2014/0293164 A1 | 10/2014 | Kim et al. | |
| 2015/0014631 A1 | 1/2015 | Ohlsson et al. | |
| 2015/0076450 A1 | 3/2015 | Weman et al. | |
| 2015/0194549 A1 | 7/2015 | Fimland et al. | |
| 2015/0255677 A1 | 9/2015 | Dechoux et al. | |
| 2015/0311363 A1 | 10/2015 | Park et al. | |
| 2016/0005751 A1 | 1/2016 | Tsui et al. | |

FOREIGN PATENT DOCUMENTS

| | | |
|---|---|---|
| CN | 102254969 A | 11/2011 |
| CN | 102376817 A | 3/2012 |
| CN | 103050498 A | 4/2013 |
| EP | 1829141 A2 | 9/2007 |
| EP | 1952467 A2 | 8/2008 |
| JP | 2002280610 A | 9/2002 |
| JP | 2007051327 A | 3/2007 |
| JP | 2009010012 A | 1/2009 |
| JP | 2012250868 A | 12/2012 |
| JP | 2013129548 A | 7/2013 |

(56) References Cited

FOREIGN PATENT DOCUMENTS

| JP | 2014120548 A | 6/2014 |
|---|---|---|
| KR | 20090003840 A | 1/2009 |
| KR | 20100094228 A | 8/2010 |
| KR | 20110061492 A | 6/2011 |
| KR | 20120035841 A | 4/2012 |
| KR | 20120036129 A | 4/2012 |
| KR | 20120083084 A | 7/2012 |
| KR | 20120092431 A | 8/2012 |
| KR | 101517551 B1 | 5/2015 |
| WO | 2006062947 A2 | 6/2006 |
| WO | 2007061945 A3 | 4/2009 |
| WO | 2010056061 A2 | 5/2010 |
| WO | 2010056064 A2 | 5/2010 |
| WO | 2010096035 A1 | 8/2010 |
| WO | 2011016837 A1 | 2/2011 |
| WO | 2011081440 A2 | 7/2011 |
| WO | 2011090863 A1 | 7/2011 |
| WO | 2011160051 A2 | 12/2011 |
| WO | 2012029381 A1 | 3/2012 |
| WO | 2012080252 A1 | 6/2012 |
| WO | 2013104723 A1 | 7/2013 |
| WO | 2013121289 A2 | 8/2013 |

OTHER PUBLICATIONS

Kent, et al., "Deep ultraviolet emitting polarization induced nanowire light emitting diods with AlxGa(1-x)N active regions", Nanotechnology, 2014, 25, 455201.
Mulyana, et al., "Reverisble Oxidation of Graphene Through Ultraviolet/Ozone Treatment and Its Nonthermal Reduction through Ultraviolet Irradiation", J Phys Chem C, 2014, 118(47), 27372-27381.
Musolino, et al., "Compatibility of the selective area growth of GaN nanowires on AlN-buffered Si substrates with the operation of light emitting diodes", Nanotechnology 2015, 26, 085605.
Park, Jun Beom et al., "Metal catalyst-assisted growth of GaN nanowires on graphene films for flexible photocatalyst applications", Current Applied Physics, 2014, 14, 1437-1442.
Toko, et al., "Selective formation of large-grained (100)- or (111)-oreinted Si on glass by Al-induced layer exchange", J Appl Phys, 2014, 115, 094301.
Yamaguchi, et al., "Passivating chemical vapor deposited graphene with metal oxides for transfer and transistor fabrication processes", Appl Phys Lett, 2013, 102, 143505.
Yin, et al., "Application of CVD graphene as transparent front electrode in Cu(In, GA)Se2 solar cell", 2014 IEEE 40th Photovoltaic Specialist Conference (PVSC), pp. 1740-1744, XP032660257.
Yu, et al., "Electronic properties of nitrogen-atom-adsorbed graphene nanoribbons with armchair edges", IEEE transactions on Nanotechnology, 2010, 9(2).
Zhao, et al., "Aluminum nitride nanowire light emitting diodes: Breaking the fundamental bottleneck of deep ultraviolet light sources", Scientific Reports, 2015, 5, 8332.
Office Action dated Dec. 9, 2015 in U.S. Appl. No. 13/993,740.
Office Action dated Aug. 29, 2016 in U.S. Appl. No. 13/993,740.
Office Action dated Mar. 22, 2017 in U.S. Appl. No. 13/993,740.
Notice of Allowability dated Jan. 9, 2018 in related U.S. Appl. No. 13/993,740.
Office Action dated Jan. 14, 2016 in related U.S. Appl. No. 14/371,621.
Office Action dated Oct. 17, 2016 in related U.S. Appl. No. 14/371,621.
Office Action dated May 3, 2017 in related U.S. Appl. No. 14/371,621.
Office Action dated Jan. 2, 2018 in related U.S. Appl. No. 14/371,621.
Notice of Allowance dated Oct. 30, 2018 in U.S. Appl. No. 14/371,621 (9 pages).
Corrected Notice of Allowability dated Jan. 9, 2019 in U.S. Appl. No. 14/371,621.
Bonaccorsco, et al., "Graphene photonics and optoelectronics", Nature Photonics, 2010, 4, 611.
Boukhvalov, et al., "Chemical functionalization of graphene with defects", Nano Letters, 2008, 8(12), 4373-4379.
Chung, K. et al., "Transferrable GaN Layers Grown on ZnO-Coated Graphene Layers for Optoelectronic Devices", Science, vol. 330, No. 6004, Oct. 29, 2010 (Oct. 29, 2010), pp. 655-657.
Colombo, et al., "Ga-assisted catalyst-free growth mechanism of GaAs nanowires by molecular beam epitaxy", Phys Rev B, 2008, 77, 155326.
Dheeraj, D L. , "Controlling Crystal Phases in GaAs Nanowires Grown by Au-assisted Molecule Beam Epitaxy", Norwegian University of Science and Technology, No. 7491, Trondheim, Norway, Fifth "nanowire Growth Workshop" Nov. 4-5, Rome, Italy, 2010.
Gao, et al., "Repeated growth and bubbling transfer of graphene with millimetre-size single-crystal grains using platinum", Nat Commun 2012, 3, 699.
Heib, et al., "Growth mechanisms and optical properties of GaAs-based semiconductor microstructures by selective area epitaxy", Journal of Crystal Growth, 2008, 310, 1049-1056.
Hong, et al., "Controlled can der Waals Heteroepitaxy of InAs Nanowires on Carbon Honeycomb Lattices", ACS Nano, 2011, 5(9), 7576-7584.
Huh, et al., "UV/Ozone-Oxidized Large-Scale Graphene Platform with Large Chemical Enhancement in Surface-Enhanced Raman Scattering", ACS Nano, 2011, 5(12), 9799-9806.
Kim, et al., "Realization of a high mobility dual-gated graphene field-effect transistor with Al2O3 dielectric", Appl. Phys. Lett. 2009, 94, 062107.
Kim, et al., "Vertically aligned ZnO nanostructures grown on graphene layers", Applied Physics Letters, 2009, 95, 213101-1 through 213101-3.
Kishino, et al., "Improved Ti-mask selective-area growth (SAG) by rf-plasma-assisted molecular beam epitaxy demonstrating extremely uniform GaN nanocolumn arrays", J. Crystal Growth 2009, 311, 2063-68.
Kneissl, et al., "Advances in group III-nitride-based deep UV light-emitting diode technology", Semiconductor Sci and Tech, 2011, 26, 014036.
Mariani, et al., "Patterned radial GaAs nanopillar solar cells", Nano Letters, 2011, 11, 2490-2494.
Marzouki, et al., "Structural and optical characterizations of nitrogen doped ZnO nanowires grown by MOCVD", Materials Letters, 2010, 64, 2112-2114.
Mohseni, et al., "Hybrid GaAs-Nanowire Carbon-Nanotube Flexible Photovoltaics", IEEE Journal of Selected Topics in Quantum Electrionics, 201, 17(4), 1070-1077.
Nevidomskyy, et al., "Chemically active substitutional nitrogen impurity in carbon nanotubes", Phys Rev Lett, 91, 105502.
Nistor, et al., "The role of chemistry in graphene doping for carbon-based electronics", ACS Nano, 2011, 5(4), 3096-3103.
Paek, et al., "MBE-VLS growth of GaAs nanowires on (111)Si substrate", Physica Status Solidi (C), 2008, 5(9), 2740-2742.
Park, et al., "Inorganic nanostructures grown on graphene layers", Nanoscale, 3, 3522, 2011.
Patsha, et al., "Growth of GaN nanostructures on graphene", Nanoscience, 2011 International Conference on Enginieering and Technology (ICONSET), pp. 553-555.
International Report on Patentability and Written Opinion, dated Jul. 15, 2014 in related International Application No. PCE/EP2013/050419.
International Search Report, dated Apr. 8, 2013 in related International Application No. PCE/EP2013/050419.
International Report on Patentability and Written Opinion, dated Jun. 8, 2013 in related International Application No. PCT/EP2011/072612.
International Search Report, dated May 2, 2012, in related international Application No. PCT/EP2011/072612.
International Search Report and Written Opinion dated Jan. 16, 2014 in related International ApplicationNo. PCT/EP2013/063071.
Search Report dated Dec. 6, 2012 in corresponding GB Application No. GB1211038.3.
Pela, et al., "Accurate band gaps of AlGaN, InGaN, and AlInN alloys calculations based on LDA-1/2 approach", Appl Phys Lett, 2011, 98, 151907.

(56) References Cited

OTHER PUBLICATIONS

Peng, et al., "Control of growth orientation of GaN nanowires", Chemical Physics Letters, 2002, 359, 241-245.
Pierret, et al., "Generic nanp-imprint process for fabrication of nanowire arrays", Nanotechnology, 21(6), 065305.
Plissard, et al., "Gold-free growth of GaAs nanowires on silicon: arrays and polytypism", Nanotechnology, 2010, 21, 1-8.
Plissard, et al., "High yield of self-catalyzed GaAs nanowire arrays grown on silicon via gallium droplet positioning", Nanotechnology, 2011, 22, 275602.
Sun, et al., "Compounds Semiconductor Nanowire Solar Cells, IEEE Journal of Selected Topics in Quantum Electronics", 2011, 17(4), 1033-1049.
Tomioka, et al., "Control of InAs Nanowire Growth Directions on Si", Nano Letters, 2008, 8(10), 3475-3480.
Wang, et al., "Growth of Nanowires", Materials Science and Engineering, 2008, 60, 1-51.
Wang, et al., "Nanocrystal growth on graphene in various degrees of oxidation", Journal of American Chemical Society, 2010, 132, 3270-3271.
Yoon, et al., "Vertical epitaxial Co5Ge7 nanowires and nanobelt arrays on a thin graphitic layer for flexible Field Emission Displays", Advanced Materials, 2009, 21, 4979-4982.
Yu, et al., "Electronic properties of nitrogen-atom-adsorbed graphene nanoribbons with armchair edges", IEEE transactions on Nanotechnology, 2010, 9(2), 243-247.
Nayak, et al., "Surface nitriding of graphite substrate by plasma focus device towards synthesis of carbon nitride coating", Surface and Coatings Technology, 2001, 145, 8-15.
"Nanocomposite Thin Films and Coatings-Processing, Properties, Performance, Table 2.1. The Physical, Mechanical and Thermal Properties of Hard Materials, 2007, World Scientific."
Jiang, Yeping et al., "Fermi-Level Tuning of Epitaxial $Sb_2Te_3$ Thin Films on Graphene by Regulating Intrinsic Defects and Substrate Transfer Doping", Physical Review Letters, 2012, 108:066809.
Park, et al., "Hybrid Semiconductor Nanostructures with Graphene Layers", 2012, Chapter 6.
Virojanadara, et al., "Large homogeneous mono-/bi-ayer graphene on 6H-SiC (0001) and buffer layer elimination", J Phys D: Appl Phys. 2010, 43, 374010.
Yoo, et al., "Microstructural defects in GaN thin films grown on chemically vapor-deposited graphene layers", Applied Physics Letters 2013, 102 (5): 051908-1-051908-3.
Kind, H et al., Nanowire Ultraviolet Photodetectors and Optical Switches, Advanced Materials, 2002, 14(2), 158-160.
Lee, Chul-Ho et al., "Flexible Inorganic Nanostructure Light-Emitting Diodes Fabricated on Graphene Films," Advanced Materials, 2011, 23, 4614-4619.
Tateno, K. et al., "VLS Growth of III-V Semiconductor Nanowires on Graphene Layers," MRS Online Proceedings, 2012, 1439, 45-50, XP002732679.

* cited by examiner

SOLAR CELLS

This invention concerns a process for growing nanowires epitaxially on graphitic substrates and subsequently providing those nanowires with shells and conductive coatings. In particular, the invention employs molecular beam epitaxy techniques to grow nanowires epitaxially and ideally vertically on graphitic substrates, allowing a shell material and then an outer conductive coating material to be carried on the nanowires. The resulting coated core shell nanowires form a further aspect of the invention. The core shell nanowires with graphitic substrate and outer conductive coating form a cell that can be used to absorb photons in solar applications.

Over recent years, the interest in semiconductor nanowires has intensified as nanotechnology becomes an important engineering discipline. Nanowires, which are also referred to as nanowhiskers, nanorods, nanopillars or nanocolumns etc by some authors, have found important applications in a variety of electrical devices such as sensors, solar cells to LED's.

For the purpose of this application, the term nanowire is to be interpreted as a structure being essentially in one-dimensional form, i.e. is of nanometer dimensions in its width or diameter and its length typically in the range of a few 100 nm to a few µm. Usually, nanowires are considered to have at least two dimensions not greater than 500 nm.

Controlling the one-dimensional growth on the nanometer scale offers unique opportunities for combining materials, and manipulating properties, including mechanical, electrical, optical, thermoelectrical, piezoelectrical and electromagnetical properties, and to design novel devices.

Many different types of nanowires exist, including metallic (e.g., Ni, Pt, Au), semiconducting (e.g., Si, InP, GaN, GaAs, ZnO etc.), and insulating (e.g., $SiO_2$, $TiO_2$) nanowires. The present inventors are primarily concerned with semiconductor nanowires although it is envisaged that the principles outlined in detail below are applicable to all manner of nanowire technology.

Conventionally, semiconductor nanowires have been grown on a substrate identical to the nanowire itself (homoepitaxial growth). Thus GaAs nanowires are grown on GaAs substrates and so on. This, of course, ensures that there is a lattice match between the crystal structure of the substrate and the crystal structure of the growing nanowire. Both substrate and nanowire can have identical crystal structures.

Growing a nanowire on a matching substrate is, however, very expensive and limiting. For example, GaAs substrates need to be specifically manufactured and that is expensive. In order to ensure nanowire growth in the normally favoured [111]B direction, the substrate needs to be specially sliced to have (111)B oriented surface, as compared to the more normal substrate with (001) oriented surface. (111)B oriented GaAs substrates are more expensive than (001) oriented GaAs substrates. Also, GaAs is not the ideal material to carry a nanowire anyway. It is brittle and is not inert for example. It is not flexible or transparent. It would be better if other more attractive substrates could be employed.

The present inventors sought ways of moving away from these limiting substrates. Of course, doing so is not just a matter of using a different substrate. As soon as the substrate is different from the nanowire being grown then there is, by definition, a potential lattice mismatch between substrate and nanowire as well as numerous other possible problems to consider. Nevertheless, the literature contains attempts by other workers to grow semiconductor nanowires on alternative substrates.

In Plissard et al., Nanotechnology 21 (2010), 385602-10, attempts have been made to grow vertical GaAs nanowires on silicon (111) oriented substrates using Ga as a catalyst. Silicon is obviously, a preferred electronics substrate but it too is expensive in pure form. Moreover, it is not transparent and is not flexible. It also suffers from a negative interaction with gold, a catalyst often used in nanowire growth. Gold can diffuse into silicon and create mid-gap defect states in the nanowire and substrate. Plissard et al. concludes, in fact, that the use of gold with a Si substrate is not desirable and develops a gold free nanowire growth technique.

The present inventors sought to grow nanowires epitaxially on graphitic substrates. Graphitic substrates are substrates composed of single or multiple layers of graphene or its derivatives. In its finest form, graphene is a one atomic layer thick sheet of carbon atoms bound together with double electron bonds (called a $sp^2$ bond) arranged in a honeycomb lattice pattern. Unlike other semiconductor substrates such as GaAs substrates, graphitic substrates are very cheap, readily available materials which offer an ideal substrate for growth of nanowires. The use of few layered graphene substrates is ideal as these are thin, light, and flexible, yet very strong. Their electrical properties can be modified from highly electrically conducting to insulating. It is also impervious to anything, very inert and hence compatible with gold and other catalysts.

However, defect free epitaxial growth of nanowires between such different material classes is not obvious, since (most) semiconductors are three dimensional like with reactive dangling bonds at the surface, whereas graphite has a two dimensional honeycomb structure with no dangling bonds at the surface and thus forms a very inert and hydrophobic surface.

Growing nanowires on substrates such as graphite can also be challenging as large lattice mismatches between the substrate and the growing nanowire were perceived to exist. Large lattice mismatches can lead to defective nanowires with dislocations or in fact to no nanowire growth at all. It is important to grow the nanowire epitaxially so that the nanowire will be ordered and adopts a compatible crystal structure that matches the substrate.

For many applications it will be important that the nanowires can be grown vertically, perpendicular to the substrate surface. Semiconductor nanowires normally grow in the [111] direction (if cubic crystal structure) or the [0001] direction (if hexagonal crystal structure). This means that the substrate surface needs to be (111) or (0001) oriented where the surface atoms of the substrate is arranged in a hexagonal symmetry.

There remain many hurdles to overcome before a semiconductor nanowire can be grown on a graphitic surface.

As noted above, attempts have been made to grow vertical GaAs nanowires on Si(111)substrates. The present invention concerns only graphitic substrates. Some attempts have been made to grow crystalline nanomaterials on graphitic substrates too.

In JACS, 2010, 132, 3270-3271 nanocrystals of oxides and hydroxides of Ni, Co and Fe are synthesised on a graphene support.

In Appl. Phys Lett. 95, 213101 (2009), Kim et al. report vertically aligned ZnO nanostructures grown on graphene layers. These were grown using catalyst free metal-organic vapour phase epitaxy (MOVPE) and the surface morphology of the ZnO nanostructures was dependent on the growth temperature.

The present inventors have found that epitaxial nanowires of certain compounds/elements can be grown on graphitic substrates. Since graphitic substrates have no dangling bonds at the surface and very short atomic bond length compared with typical semiconductors like silicon and GaAs there is no reason to anticipate nucleation and epitaxial growth of nanowires thereon. As surprisingly noted below, there is a good lattice match with many semiconductors when using graphene depending on how the semiconductor atoms are placed on the surface of graphene.

In particular, the use of molecular beam epitaxy offers excellent results in terms of nanowire growth. In particular the invention enables the growth of group IV, group II-VI or in particular group III-V semiconductor nanowires on graphitic substrates. The present inventors have used this surprising ability to grow epitaxial nanowires on conductive graphitic substrates and developed the concept to form photovoltaic cells which can absorb photons and therefore offer value in solar technology and as photodetectors.

SUMMARY OF INVENTION

Thus, viewed from one aspect the invention provides a composition of matter, in particular a photovoltaic cell, comprising:

at least one core semiconductor nanowire on a graphitic substrate, said at least one core nanowire having been grown epitaxially on said substrate wherein said nanowire comprises at least one group III-V compound or at least one group II-VI compound or at least one group IV element;

a semiconductor shell surrounding said core nanowire, said shell comprising at least one group III-V compound or at least one group II-VI compound or at least one group IV element such that said core nanowire and said shell form a n-type semiconductor and a p-type semiconductor respectively or vice versa; and an outer conducting coating surrounding said shell which forms an electrode contact.

Viewed from another aspect the invention provides a composition of matter, in particular a photovoltaic cell, comprising:

at least one core semiconductor nanowire on a graphitic substrate, said at least one core nanowire having been grown epitaxially on said substrate wherein said nanowire comprises at least one group III-V compound or at least one group II-VI compound or at least one group IV element;

a semiconductor shell surrounding said core nanowire, said shell comprising at least one group III-V compound or at least one group II-VI compound or at least one group IV element such that said core nanowire and said shell form a n-type semiconductor and a p-type semiconductor respectively or vice versa; and an outer contact and/or conducting layer which contacts the top of the semiconductor shell on said nanowire and which forms an electrode, e.g. a transparent graphitic layer such as graphene.

Viewed from another aspect the invention provides a composition of matter, in particular a photovoltaic cell, comprising:

at least one core semiconductor nanowire on a graphitic substrate, said at least one core nanowire having been grown epitaxially on said substrate wherein said nanowire comprises at least one group III-V compound or at least one group II-VI compound or at least one group IV element;

a semiconductor shell surrounding said core nanowire, said shell comprising at least one group III-V compound or at least one group II-VI compound or at least one group IV element such that said core nanowire and said shell form a n-type semiconductor and a p-type semiconductor respectively or vice versa; and optionally an outer conducting coating surrounding said shell which forms an electrode contact or a contact and/or conducting layer which contacts the top of the semiconductor shell on said nanowire and which forms an electrode, e.g. a transparent graphitic layer such as graphene.

Viewed from another aspect the invention provides a process for preparing a cell as hereinbefore defined comprising:

(I) providing group II-VI elements or group III-V elements or at least one group IV element to the surface of said graphitic substrate, preferably via a molecular beam;

(II) epitaxially growing at least one nanowire from the surface of the graphitic substrate to provide a nanowire core;

(III) coating said at least one nanowire core with a shell comprising at least one group III-V compound or at least one group II-VI compound or at least one group IV element such that said core nanowire and said shell form a n/p junction or a p/n junction respectively; and (IV) coating said shell with an outer conducting coating surrounding said shell which forms an electrode contact, preferably a transparent electrode contact; or providing a conducting layer which contacts the top of the semiconductor shell on said nanowire and which forms an electrode, e.g. a transparent graphitic layer such as graphene.

Viewed from another aspect the invention provides a process for preparing a cell as hereinbefore defined wherein at least one nanowire is grown epitaxially on a graphitic substrate in the presence of a catalyst.

Optionally, the surface of the graphitic substrate can be chemically/physically modified to enhance the epitaxial growth of nanowires.

Viewed from another aspect the invention provides a device, such as a solar cell, comprising a cell as hereinbefore defined.

Viewed from another aspect the invention provides a solar cell comprising a plurality of photovoltaic cells as hereinbefore defined.

Viewed from another aspect the invention provides a solar cell comprising a plurality of photovoltaic cells as hereinbefore defined wherein at least two of said photovoltaic cells have a different band gap and thereby absorb light of different wavelengths.

Definitions

By a group III-V compound is meant one comprising at least one ion from group III and at least one ion from group V. Similarly, a group II-VI compound is one comprising at least one group II ion and at least one group VI ion. In this application the term group (II) covers both classic group (IIa) and (IIb) periods, i.e. the alkaline earth series and the Zn series of elements. Group IV elements include Si and Ge. It will be appreciated that the term group IV element covers both a single group IV element and also the presence of two such elements which may combine to form a compound such as SiC or SiGe. There may be more than one ion present from each group, e.g. so as to form InGaAs and so on.

The term nanowire is used herein to describe a solid, wire like structure of nano dimensions. Nanowires preferably have an even diameter throughout the majority of the nanowire, e.g. at least 75% of its length. The term nanowire is intended to cover the use of nanorods, nanopillars, nanocolumns or nanowhiskers some of which may have tapered end structures. The nanowires can be said to be in essentially in one-dimensional form with nanometer dimensions in their width or diameter and their length typically in the range of a few 100 nm to a few μm, e.g. 6 to 8 microns. Typically, the nanowire will have two dimensions not greater than 700 nm, ideally not greater than 600 nm, especially not greater than 500 nm.

Ideally, the diameter at the base of the nanowire and at the top of the nanowire should remain about the same (e.g. within 20% of each other). It will be appreciated that the wire has to narrow at the very top, typically forming a hemisphere.

It will be appreciated that the substrate preferably comprises a plurality of nanowires. This may be called an array of nanowires.

Graphitic substrates are substrates composed of single or multiple layers of graphene or its derivatives. The term graphene refers to a planar sheet of $sp^2$-bonded carbon atoms in a honeycomb crystal structure. Derivatives of graphene are those with surface modification. For example, the hydrogen atoms can be attached to the graphene surface to form graphene. Graphene with oxygen atoms attached to the surface along with carbon and hydrogen atoms is called as graphene oxide. The surface modification can be also possible by chemical doping or oxygen/hydrogen plasma treatment.

The term epitaxy comes from the Greek roots epi, meaning "above", and taxis, meaning "in ordered manner". The atomic arrangement of the nanowire is based on the crystallographic structure of the substrate. It is a term well used in this art. Epitaxial growth means herein the growth on the substrate of a nanowire that mimics the orientation of the substrate.

Molecular beam epitaxy (MBE) is a method of forming depositions on crystalline substrates. The MBE process is performed by heating a crystalline substrate in a vacuum so as to energize the substrate's lattice structure. Then, an atomic or molecular mass beam(s) is directed onto the substrate's surface. The term element used above is intended to cover application of atoms, molecules or ions of that element. When the directed atoms or molecules arrive at the substrate's surface, the directed atoms or molecules encounter the substrate's energized lattice structure or a catalyst droplet as described in detail below. Over time, the oncoming atoms form a nanowire.

The term photovoltaic cell is used to imply the presence of the semiconductor core/shell materials and two electrodes (contacts). The cell can convert photons from the sun into electricity.

The terms n/p junction or a p/n junction imply that one of the core or shell layers is a p-type semiconductor and the other is a n-type semiconductor thus creating a radial p/n junction at the interface between the two layers.

DETAILED DESCRIPTION OF INVENTION

This invention concerns the epitaxial growth of nanowires on a graphitic substrate as a first step. The composition of the invention comprises both the substrate and the nanowires grown thereon.

Having a nanowire grown epitaxially provides homogeneity to the formed material which may enhance various end properties, e.g. mechanical, optical or electrical properties.

Epitaxial nanowires may be grown from gaseous or liquid precursors. Because the substrate acts as a seed crystal, the deposited nanowire can take on a lattice structure and orientation identical to those of the substrate. This is different from other thin-film deposition methods which deposit polycrystalline or amorphous films, even on single-crystal substrates.

In the present invention, the substrate is a graphitic substrate, more especially it is graphene. As used herein, the term graphene refers to a planar sheet of $sp^2$-bonded carbon atoms that are densely packed in a honeycomb (hexagonal) crystal lattice. This graphene substrate should contain no more than 10 layers of graphene or its derivatives, preferably no more than 5 layers (which is called as a few-layered graphene). Especially preferably, it is a one-atom-thick planar sheet of graphene.

The crystalline or "flake" form of graphite consists of many graphene sheets stacked together (i.e. more than 10 sheets). By graphitic substrate therefore, is meant one formed from one or a plurality of graphene sheets.

It is preferred if the substrate is 20 nm in thickness or less. Graphene sheets stack to form graphite with an interplanar spacing of 0.335 nm. The substrate preferred comprises only a few such layers and may ideally be less than 10 nm in thickness. Even more preferably, it may be 5 nm or less in thickness. The area of the substrate is not limited. This might be as much as 0.5 mm$^2$ or more, e.g. up to 5 mm$^2$ or more such as up to 10 cm$^2$. The area of the substrate is thus only limited by practicalities.

It will be clear that the graphitic substrate may need to be supported in order to allow growth of the nanowires thereon. The graphene sheet can be supported on any kind of materials including conventional semiconductor substrates and transparent glasses. The use of silica or SiC is preferred. The support must be inert. It is also possible to grow the graphitic substrate directly on metallic film deposited on an oxidized silicon wafer or directly on metal foils. Then the graphitic substrates can be detached from the metal by etching and easily transferred on to any materials.

For the lowest or bottom cell in a stack (as described later herein) the cell substrate does not need to be transparent. Thus, if graphene on metal foil is used as a substrate this can be used directly as the bottom electrode. In this case, therefore the graphene does not need to be removed from the metal foil. However, if a cell is not the bottom cell in a stack then the substrates should be transparent to allow light to penetrate down to the next cell in a stack.

In a highly preferred embodiment, the carrier material used will be transparent, e.g. glass. The use of a transparent carrier material is important in the solar technology field in order to allow light to penetrate the solar cells of the invention.

In a highly preferred embodiment, the graphitic substrate is a laminated substrate exfoliated from a Kish graphite, or is a highly ordered pyrolytic graphite (HOPG). Alternatively, it could be a chemical vapour deposition (CVD)-grown graphene substrate on metallic films or foils made of e.g. Cu, Ni, or Pt.

Whilst it is preferred if the graphitic substrate is used without modification, the surface of the graphitic substrate can be modified. For example, it can be treated with plasma of hydrogen, oxygen, $NO_2$ or their combinations. Oxidation of the substrate might enhance nanowire nucleation. It may also be preferable to pretreat the substrate, for example, to ensure purity before nanowire growth. Treatment with a strong acid such as HF or BOE is an option. Substrates might be washed with iso-propanol, acetone, or n-methyl-2-pyrrolidone to eliminate surface impurities.

The cleaned graphitic surface can be further modified by doping. Dopant atoms or molecules may act as a seed for growing nanowires. The graphitic substrate may be doped by adsorption of organic or inorganic molecules such as metal-chlorides ($FeCl_3$, $AuCl_3$ or $GaCl_3$), $NO_2$, $HNO_3$, aromatic molecules or ammonia. A solution of $FeCl_3$, $AuCl_3$ or $GaCl_3$ could therefore be used in a doping step.

It is also envisaged that the surface of the graphitic substrate can therefore be doped by substitutional doping method during its growth with incorporation of dopants such as B, N, S, or Si.

Preferably the graphitic substrate is doped with the same doping materials as the nanowires.

The use of graphitic substrates, ideally thin graphitic substrates, is highly advantageous in the present invention as these are thin but very strong, light and flexible, highly electrically conducting and thermally conducting. They are transparent at the low thicknesses preferably employed herein, they are impermeable and inert.

To enhance the conductivity of the graphitic substrate, metallic nanostructures such as nanowires and nanoparticles with high conductivity ($>10^3$ S/cm) can be dispersed on top, in particular in such a way that they are partly interconnected e.g. a Ag nanowire/graphene hybrid top contact.

In order to prepare nanowires of commercial importance, it is essential that these grow epitaxially on the substrate. It is also ideal if growth occurs perpendicular to the substrate and ideally therefore in the [111] (for cubic crystal structure) or [0001] (for hexagonal crystal structure) direction. As noted above, there is no guarantee that this is possible with a particular substrate where that substrate material is different from the nanowire being grown. The present inventors have determined, however, that epitaxial growth on graphitic substrates is possible by determining a possible lattice match between the atoms in the semiconductor nanowire and the carbon atoms in the graphene sheet.

The carbon-carbon bond length in graphene layers is about 0.142 nm. Graphite has hexagonal crystal geometry. The present inventors have surprisingly realised that graphite can provide a substrate on which semiconductor nanowires can be grown as the lattice mismatch between the growing nanowire material and the graphitic substrate can be very low.

The inventors have realised that due to the hexagonal symmetry of the graphitic substrate and the hexagonal symmetry of the semiconductor atoms in the (111) planes of a nanowire growing in the [111] direction with a cubic crystal structure (or in the (0001) planes of a nanowire growing in the [0001] direction with a hexagonal crystal structure), a close lattice match can be achieved between the growing nanowires and the substrate.

FIGS. 1a-1d show four different hexagonal structural configurations of the semiconductor atoms in the (111) (or (0001)) planes of a nanowire on top of the hexagonal lattice of carbon atoms in the graphene layer, placed in such a way that no lattice mismatch will occur. As possible semiconductor adsorption sites on top of graphene, we consider 1) above the center of the hexagonal carbon rings of graphene (H-site) and 2) above the bridge between carbon atoms (B-site), as indicated by arrows in FIG. 1a.

The figures show an idealized lattice-matched arrangement of the semiconductor atoms in the (111) planes of a cubic crystal ((0001) planes for hexagonal) when the atoms are placed on 1) H- and B-sites (FIGS. 1a, 1b and 1d), and 2) H- or B-sites (FIG. 1c). Dashed lines emphasize the hexagonal symmetry of the lattice of semiconductor atoms in the (111) plane. The relative rotations of these hexagons for each atomic arrangement are written on the top of each figure. For (FIG. 1a) and (FIG. 1d) two relative orientations are possible, ±10.9° and ±16.1°, respectively (only the + rotations are shown in the images).

FIG. 1e shows artificial lattice-matched lattice constants for the atomic arrangements in (a), (b), (c) and (d). Dashed and solid lines correspond to the hexagonal ($a_1$) and cubic ($a=a_1\times\sqrt{2}$) crystal phases of these lattices, respectively. The square (■) and the hexagon represent the cubic and the hexagonal phases, respectively, for Si, ZnO, and group III-V semiconductors. Squares (GaAs, AlAs, AlSb) with two different colours indicate that the semiconductor can adopt either of two atomic arrangements on graphene. The figure visualizes the vast possibilities for epitaxial growth of vertical semiconductor nanowires on graphitic substrates.

If the semiconductor atoms are placed above alternating H- and B-sites as in FIG. 1a, an exact lattice match can be achieved if the lattice constant, a, of a cubic semiconductor crystal (the lattice constant, a, is defined as the side length of the cubic unit cell) is equal to: 4.607 Å. A few cubic semiconductors exist with lattice constants close to this value, with the closest being SiC (a=4.36 Å), AlN (a=4.40 Å) and GaN (a=4.51 Å). For hexagonal semiconductor crystals, exact lattice matches will be achieved if the lattice constant, $a_1$, is equal to: 3.258 Å. A few hexagonal semiconductors exist with lattice constants close to this value, with the closest being SiC ($a_1$=3.07 Å), AlN ($a_1$=3.11 Å), GaN ($a_1$=3.19 Å) and ZnO ($a_1$=3.25 Å) crystals.

If the semiconductor atoms are placed above alternating H- and B-sites as in FIG. 1b, an exact lattice match can be achieved if the lattice constant, a, of a cubic semiconductor crystal is equal to: 1.422 Å (carbon atom distance)×3/2×sqr(6)=5.225 Å. This is close to the lattice constant of Si (a=5.43 Å), GaP (a=5.45 Å), AlP (a=5.45 Å), InN (a=4.98 Å) and ZnS (a=5.42 Å). For hexagonal semiconductor crystals exact lattice matches will be achieved if the lattice constant, $a_1$, is equal to: 1.422 Å×3/2×sqr(3)=3.694 Å. This is close to the $a_1$ lattice constants of the hexagonal forms of InN ($a_1$=3.54 Å) and ZnS ($a_1$=3.82 Å) crystals.

For the atomic configuration as in FIG. 1c an exact lattice match can be achieved if the lattice constant, a, of a cubic semiconductor crystal is equal to: 1.422 Å (carbon atom distance)×3×sqr(2)=6.033 Å. This is close to the lattice constant of group III-V compounds such as InAs, GaAs, InP, GaSb, AlSb and AlAs, and II-VI compounds such as MgSe, ZnTe, CdSe, and ZnSe semiconductor crystals. In particular, this is close to the lattice constant of group III-V compounds such as InAs (a=6.058 Å), GaSb (a=6.096 Å) and AlSb (a=6.136 Å), and II-VI compounds such as ZnTe (a=6.103 Å) and CdSe (a=6.052 Å) semiconductor crystals.

For hexagonal semiconductor crystals, exact lattice matches will be achieved if the lattice constant, $a_1$, is equal to: 1.422 Å (carbon atom distance)×3=4.266 Å. This is close to the $a_1$ lattice constants of the hexagonal forms of the II-VI materials CdS ($a_1$=4.160 Å) and CdSe ($a_1$=4.30 Å) crystals.

If the semiconductor atoms are placed above alternating H- and B-sites as in FIG. 1d, an exact lattice match can be achieved if the lattice constant, a, of a cubic semiconductor crystal is equal to: 6.28 Å. This is close to the lattice constant of InSb (a=6.479 Å), MgTe (a=6.42 Å) and CdTe (a=6.48 Å). For hexagonal semiconductor crystals, exact lattice matches will be achieved if the lattice constant, $a_1$, is equal to: 4.44 Å. This is close to the $a_1$ lattice constants of the hexagonal forms of InSb ($a_1$=4.58 Å), MgTe ($a_1$=4.54 Å) and CdTe ($a_1$=4.58 Å) crystals.

Without wishing to be limited by theory, due to the hexagonal symmetry of the carbon atoms in graphitic layers, and the hexagonal symmetry of the atoms of cubic or hexagonal semiconductors in the [111] and [0001] crystal direction, respectively, (a preferred direction for most nanowire growth), a close lattice match between the graphitic substrate and semiconductor can be achieved when the semiconductor atoms are placed above the carbon atoms of the graphitic substrate, ideally in a hexagonal pattern. This is a new and surprising finding and can enable the epitaxial growth of nanowires on graphitic substrates.

The four different hexagonal arrangements of the semiconductor atoms as described above, can enable semiconductor nanowires of such materials to be vertically grown to form free standing nanowires on top of a thin carbon-based graphitic material.

Whilst it is ideal that there is no lattice mismatch between a growing nanowire and the substrate, nanowires can accommodate much more lattice mismatch than thin films for example. The nanowires of the invention may have a lattice mismatch of up to about 10% with the substrate and epitaxial growth is still possible. Ideally, lattice mismatches should be 7.5% or less, e.g. 5% or less.

For some semiconductors like cubic InAs (a=6.058 Å), cubic GaSb (a=6.093 Å), cubic CdSe (a=6.052 Å), hexagonal CdSe ($a_1$=4.30 Å) and hexagonal ZnO ($a_1$=3.25 Å) the lattice mismatch is so small (<~1%) that excellent growth of these semiconductors can be expected.

For some semiconductors like GaAs (a=5.653 Å) the lattice mismatch is quite similar when the semiconductor atoms are placed on the same sites as in FIG. 1c (a=6.033 Å and thus the lattice constant for GaAs is 6.3% smaller), or alternating H- and B-sites as in FIG. 1b (a=5.255 Å and thus the lattice constant for GaAs is 8.2% larger), that both arrangements are possible. The process of the invention can enable semiconductor nanowires of the above mentioned materials to be vertically grown to form free standing nanowires on top of a thin carbon-based graphitic material.

The nanowire grown in the present invention may be from 250 nm to several microns in length, e.g. up to 8 microns or up to 6 microns. Preferably the nanowires are at least 1 micron in length. Where a plurality of nanowires are grown, it is preferred if they all meet these dimension requirements. Ideally, at least 90% of the nanowires grown on a substrate will be at least 1 micron in length. Preferably substantially all the nanowires will be at least 1 micron in length.

Moreover, it will be preferred if the nanowires grown have the same dimensions, e.g. to within 10% of each other. Thus, at least 90% (preferably substantially all) of the nanowires on a substrate will preferably be of the same diameter and/or the same length (i.e. to within 10% of the diameter/length of each other). Essentially, therefore the skilled man is looking for homogeneity and nanowires that are substantially the same in terms of dimensions.

The length of the nanowires is often controlled by the length of time for which the growing process runs. A longer process typically leads to a (much) longer nanowire.

The nanowires have typically a hexagonal cross sectional shape. The nanowire may have a cross sectional diameter of 25 to 700 nm, such as 25 to 600 nm, especially 25 to 500 nm (i.e. its thickness). As noted above, the diameter is ideally constant throughout the majority of the nanowire. Nanowire diameter can be controlled by the manipulation of the ratio of the atoms used to make the nanowire as described further below.

Moreover, the length and diameter of the nanowires can be affected by the temperature at which they are formed. Higher temperatures encourage high aspect ratios (i.e. longer and/or thinner nanowires). The skilled man is able to manipulate the growing process to design nanowires of desired dimensions.

The nanowires of the invention are formed from at least one III-V compound, at least one II-VI compound or they can be nanowires grown from at least one group IV element selected from Si, Ge, Sn or Pb, especially Si and Ge. The formation therefore of pure group IV nanowires or nanowires such as SiC and SiGe is envisaged.

Group II elements are Be, Mg, Ca, Zn, Cd, and Hg. Preferred options here are Zn and Cd.

Group III options are B, Al, Ga, In, and Tl. Preferred options here are Ga, Al and In.

Group V options are N, P, As, Sb. All are preferred.

Group VI options include O, S, Se and Te. The use of Se and Te is preferred.

The manufacture of a group III-V compound is preferred. It will be appreciated that any compound which forms during nanowire growth need not be completely stoichiometric as the possibility of doping exists, as discussed below.

Preferred compounds for nanowire manufacture include InAs, GaAs, InP, GaSb, InSb, GaP, ZnTe, SiC, CdSe and ZnSe. The use of GaAs or InAs is highly preferred. Other options include Si, ZnO, GaN, AN and InN.

Whilst the use of binary materials is preferred, there is no reason why ternary or quaternary nanowires etc. cannot be grown by the method of the invention. As long as the lattice of the compound in question matches that of the substrate, especially graphene, then epitaxial growth can be expected. Thus, ternary systems in which there are two group III cations with a group V anion are an option here, such as InGaAs and AlGaAs. The ternary compounds may therefore be of formula XYZ wherein X is a group III element, Y is a group III or V element different from X and Z and Z is a group V element. The X to Y or Y to Z molar ratio in XYZ is preferably 0.2 to 0.8, i.e. the formula is preferably $X_xY_{1-x}Z$ (or $XY_{1-x}Z_x$) where subscript x is 0.2 to 0.8. Quaternary systems may be represented by the formula $A_xB_{1-x}C_yD_{1-y}$ where A and B are group III elements and C and D are group V elements. Again subscripts x and y are typically 0.2 to 0.8. Other options will be clear to the skilled man.

It is within the scope of the invention for the nanowires to be doped. Doping typically involves the introduction of impurity ions into the nanowire. These can be introduced at a level of up to $10^{19}$/cm$^3$, preferably up to $10^{18}$/cm$^3$. The nanowires can be p-doped or n-doped as desired although as noted below it is possible for a undoped layer to be present. Doped semiconductors are extrinsic conductors whereas undoped ones are intrinsic.

Extrinsic semiconductors with a larger electron concentration than hole concentration are known as n-type semiconductors. In n-type semiconductors, electrons are the majority carriers and holes are the minority carriers. N-type semiconductors are created by doping an intrinsic semiconductor with donor impurities. Suitable donors for III-V compounds can be e.g. Si and Te.

The p-type semiconductors have a larger hole concentration than electron concentration. The phrase 'p-type' refers to the positive charge of the hole. In p-type semiconductors, holes are the majority carriers and electrons are the minority carriers. P-type semiconductors are created by doping an intrinsic semiconductor with acceptor impurities. Suitable acceptors for III-V compounds can be e.g. Be and Zn. It will be appreciated that whether an impurity will act as a donor or acceptor in a III-V compound will in some cases depend on the orientation of the growing surface and the growth conditions. Dopants can be introduced during the growth process or by ion implantation of the nanowires after their formation.

Suitable donors for group IV nanowires can be e.g. P and As. Suitable acceptors for group IV can be e.g. B and Al. Suitable donors for II-VI compounds are normally easily found and can be e.g. Al and Ga. Suitable acceptors can be more difficult to find for many II-VI compounds but can be e.g. Li and Mg.

The nanowires of the invention grow epitaxially. They attach to the underlying graphitic substrate through covalent, ionic or quasi van der Waals binding. Accordingly, at the junction of the substrate and the base of the nanowire, crystal planes are formed epitaxially within the nanowire. These build up, one upon another, in the same crystallographic direction thus allowing the epitaxial growth of the nanowire. Preferably the nanowires grow vertically. The term vertically here is used to imply that the nanowires grow perpendicular to the graphitic support. It will be appreciated that in experimental science the growth angle may not be exactly 90° but the term vertically implies that the nanowires are within about 10° of vertical/perpendicular, e.g. within 5°.

It will be appreciated that the substrate preferably comprises a plurality of nanowires. Preferably the nanowires grow about parallel to each other. It is preferred therefore if at least 90%, e.g. at least 95%, preferably substantially all nanowires grow in the same direction from the same plane of the substrate.

It will be appreciated that there are many planes within a substrate where epitaxial growth could occur. It is preferred if substantially all nanowires grow in the same plane so that they are parallel. Most preferably that plane is perpendicular to the substrate.

The nanowires of the invention should preferably grow in the [111] direction for nanowires with cubic crystal structure and [0001] direction for nanowires with hexagonal crystal structure. If the crystal structure of the growing nanowire is cubic, this also represents the (111) interface between the cubic nanowire and the catalyst droplet where axial growth takes place. If the nanowire has a hexagonal crystal structure, then the (0001) interface between the nanowire and the catalyst droplet represents the plane where axial growth takes place. Planes (111) and (0001) both represent the same (hexagonal) plane of the nanowire, it is just that the nomenclature of the plane varies depending on the crystal structure of the growing nanowire.

The nanowires are preferably grown by molecular beam epitaxy (MBE). Whilst it is within the scope of the invention for vapour deposition to be used, e.g. a CVD especially a metal organic CVD (MOCVD) or metal organic vapour phase epitaxy (MOVPE) method, the use of MBE is highly preferred. In this method, the substrate is provided with a molecular beam of each reactant, e.g. a group III element and a group V element preferably supplied simultaneously. A higher degree of control of the nucleation and growth of the nanowires on the graphitic substrate might be achieved with the MBE technique by using migration-enhanced epitaxy (MEE) or atomic-layer MBE (ALMBE) where e.g. the group III and V elements can be supplied alternatively.

A preferred technique is solid-source MBE, in which very pure elements such as gallium and arsenic are heated in separate effusion cells, until they begin to slowly evaporate (e.g. gallium) or sublimate (e.g. arsenic). The gaseous elements then condense on the substrate, where they may react with each other. In the example of gallium and arsenic, single-crystal GaAs is formed. The use of the term "beam", implies that evaporated atoms (e.g. gallium) or molecules (e.g. $As_4$ or $As_2$) do not interact with each other or vacuum chamber gases until they reach the substrate.

Doping ions can also be introduced easily using MBE. FIG. 2 is a possible set up of a MBE machine.

MBE takes place in ultra-high vacuum, with a background pressure of typically around $10^{-10}$ to $10^{-9}$ Torr. Nanostructures are typically grown slowly, such as at a speed of up to a few, such as about 10, μm per hour. This allows nanowires to grow epitaxially and maximises structural performance.

It is within the scope of the invention for nanowires to be grown in the presence or in the absence of a catalyst. Growing nanowires catalyst free is thus an embodiment of the invention.

Preferably a catalyst is used in the growth process. The catalyst can be one of the elements making up the nanowire—so called self catalysed, or different from any of the elements making up the nanowire.

For catalyst-assisted growth the catalyst may be Au or Ag or the catalyst may be a metal from the group used in the nanowire growth (e.g. group II or III metal), especially one of the metal elements making up the actual nanowire (self catalysis). It is thus possible to use another element from group III as a catalyst for growing a III-V nanowire e.g. use Ga as a catalyst for an In (group V) nanowire and so on. Preferably the catalyst is Au or the growth is self catalysed (i.e. Ga for a Ga (group V) nanowire and so on). The catalyst can be deposited onto the graphitic substrate to act as a nucleation site for the growth of the nanowires. Ideally, this can be achieved by providing a thin film of catalytic material formed over the substrate surface. When the catalyst film is melted (often forming a eutectic alloy with one or more of the semiconductor nanowire constituents), it forms droplets on the substrate and these droplets form the points where nanowires can grow. This is called vapour-liquid-solid growth (VLS) as the catalyst is the liquid, the molecular beam is the vapour and the nanowire provides the solid component. In some cases the catalyst particle can also be solid during the nanowire growth, by a so called vapour-solid-solid growth (VSS) mechanism. As the nanowire grows (by the VLS method), the liquid (e.g. gold) droplet stays on the top of the nanowire. This is depicted in the figures.

As noted above, it is also possible to prepare self catalysed nanowires. By self catalysed is meant that one of the components of the nanowire acts as a catalyst for its growth.

For example, a Ga layer can be applied to the substrate, melted to form droplets acting as nucleation sites for the growth of Ga containing nanowires. Again, a Ga metal portion may end up positioned on the top of the nanowire. A similar process can be effected using group II or group III metals as catalysts for nanowires containing the catalyst as a component.

In more detail, a Ga/In flux can be supplied to the substrate surface for a period of time to initiate the formation of Ga/In droplets on the surface upon heating of the substrate. The substrate temperature can then be set to a temperature suitable for the growth of the nanowire in question. The growth temperature may be in the range 300 to 700° C. The temperature employed is however specific to the nature of the material in the nanowire and the catalyst material. For GaAs, a preferred temperature is 590 to 630° C., e.g. 610° C. For InAs the range is lower, for example 430 to 540° C., such as 450° C.

Nanowire growth can be initiated by opening the shutter of the Ga/In effusion cell and the counter ion effusion cell, simultaneously once a catalyst film has been deposited and melted.

The temperature of the effusion cells can be used to control growth rate. Convenient growth rates, as measured during conventional planar (layer by layer) growth, are 0.05 to 2 μm per hour, e.g. 0.1 μm per hour.

The pressure of the molecular beams can also be adjusted depending on the nature of the nanowire being grown. Suitable levels for beam equivalent pressures are between $1 \times 10^{-7}$ and $1 \times 10^{-5}$ Torr.

It has been surprisingly found that the use of MBE tends to cause the growth of GaAs nanowires vertically on the (111)B plane of a GaAs substrate.

The beam flux ratio between reactants (e.g. group III atoms and group V molecules) can be varied, the preferred flux ratio being dependent on other growth parameters and on the nature of the nanowire being grown.

It has been found that the beam flux ratio between reactants can affect crystal structure of the nanowire. For example, using Au as a catalyst, growth of GaAs nanowires with a growth temperature of 540° C., a Ga flux equivalent to a planar (layer by layer) growth rate of 0.6 μm per hour, and a beam equivalent pressure (BEP) of $9 \times 10^{-6}$ Torr for $As_4$ produces wurtzite crystal structure. As opposed to this, growth of GaAs nanowires at the same growth temperature, but with a Ga flux equivalent to a planar growth rate of 0.9 μm per hour and a BEP of $4 \times 10^{-6}$ Torr for $As_4$, produces zinc blende crystal structure.

Nanowire diameter can in some cases be varied by changing the growth parameters. For example, when growing self-catalyzed GaAs nanowires under conditions where the axial nanowire growth rate is determined by the $As_4$ flux, the nanowire diameter can be increased/decreased by increasing/decreasing the Ga:$As_4$ flux ratio. The skilled man is therefore able to manipulate the nanowire in a number of ways.

It is thus an embodiment of the invention to employ a multistep, such as two step, growth procedure, e.g. to separately optimize the nanowire nucleation and nanowire growth.

A significant benefit of MBE is that the growing nanowire can be analysed in situ, for instance by using reflection high-energy electron diffraction (RHEED). RHEED is a technique typically used to characterize the surface of crystalline materials. This technology cannot be applied so readily where nanowires are formed by other techniques such as MOVPE.

One limitation of the techniques described above is that there is limited control over where nanowires grow on the surface of the substrate. Nanowires will grow where a catalyst droplet forms but there is little control over where those droplets might form. A further problem is that the size of the droplets cannot easily be controlled. If droplets form which are too small to initiate nucleation of a nanowire, yields of nanowires may be low. This is a particular problem when using gold catalysis as the droplets formed by the gold can be too small to allow high yielding nanowire growth.

In order to prepare a more regular array of nanowires, the inventors envisage the use of a mask on the substrate. This mask can be provided with regular holes, where nanowires can grow homogeneously throughout the surface. The hole patterns in the mask can be easily fabricated using conventional photo/e-beam lithography or nanoimprinting. Focused ion beam technology may also be used in order to create a regular array of nucleation sites on the graphitic surface for the nanowire growth.

Thus a mask can be applied to the substrate and etched with holes exposing the graphitic substrate surface, optionally in a regular pattern. Moreover, the size of the holes can be carefully controlled. Catalyst can then be introduced into those holes to provide nucleating sites for nanowire growth. By arranging the holes regularly, a regular pattern of nanowires can be grown.

Moreover, the size of the holes can be controlled to ensure that only one nanowire can grow in each hole. Finally, the holes can be made of a size where the droplet of catalyst that forms within the hole is sufficiently large to allow nanowire growth. In this way, a regular array of nanowires can be grown, even using Au catalysis.

The mask material can be any materials which do not damage the underlying graphitic layers significantly when deposited. The holes used in this embodiment may be slightly bigger than the nanowire diameter, e.g. up to 200 nm. The minimum hole size might be 50 nm, preferably at least 100-200 nm.

The mask itself can be made of an inert compound, such as silicon dioxide or silicon nitride. It can be provided on the substrate surface by any convenient technique such as by electron beam deposition, CVD, plasma enhanced-CVD, and sputtering. The mask itself can be less than 50 nm in thickness.

In a highly preferred embodiment, the mask also provides an insulating layer between the graphitic substrate and the outer coating discussed below.

In order to prepare positioned Au catalysed nanowires on a graphitic substrate, a thin layer of Au, such as with a thickness less than 50 nm, can be deposited after etching the hole patterns in the mask. The deposition can be made with a photo or e-beam resist on top. By removing the photo or e-beam resist, a so called "lift-off" process, a regular arrayed pattern of Au dots on the graphitic substrate surface can be fabricated. Optionally the mask may be partially or completely removed after fabrication.

Whilst it is preferred in the present invention to employ catalyst assisted growth techniques, it is envisaged that nanowires may be grown on graphitic substrates in the absence of catalyst. This may be especially possible in conjunction with a mask.

In particular, the simple use of vapour-solid growth may enable nanowire growth. Thus, in the context of MBE, simple application of the reactants, e.g. In and As, to the substrate without any catalyst can result in the formation of a nanowire. This forms a further aspect of the invention which therefore provides the direct growth of a semiconductor nanowire formed from the elements described above on a graphitic substrate. The term direct implies therefore the absence of a film of catalyst to enable growth.

As noted above, the nanowires of the invention preferably grow as cubic (zinc blende) or hexagonal (wurtzite) structures. The inventors have found that it is possible to change the crystal structure of the growing nanowire by manipulating the amounts of the reactants fed to the substrate as discussed above. Higher feeds of Ga, for example, force a GaAs crystal into the cubic crystal structure. Lower feeds encourage a hexagonal structure. By manipulating reactant concentrations, the crystal structure within the nanowire can therefore be changed.

It is also within the scope of the invention for the nature of the material forming the nanowire to be changed during the growing process. Thus, by changing the nature of the molecular beams, a portion of different structure would be introduced into a nanowire. An initial GaAs nanowire could be extended with an InAs nanowire section for example by changing from a Ga feed to an In feed. The GaAs/InAs nanowire could then be extended with a GaAs nanowire section by changing back to a Ga feed and so on. Again, by developing different structures with differing electrical properties, the inventors offer nanowires with interesting and manipulable electronic properties.

In this regard, it is a further aspect of the invention if a nanowire is grown to have an n/p junction present axially within the nanowire. This can be achieved by changing the nature of the doping material as the nanowire grows. Thus during initial growth, an n-type doping regime can be used to introduce n-type conductivity into the nanowire. By changing the dopant to a p-type dopant during the growing process, the nanowire can then comprise p-type conductivity. The junction between these two semiconductors forms an axial n/p type junction. It will be appreciated that the order of n and p semiconductors in this nanowire can vary with either p or n type material being on top and the opposite semiconductor being below.

This axial type junction is especially useful when the solar cell is provided with a graphene top contact layer as described herein. Note also, that where an axial p/n junction is present there is no requirement for a radial shell to be present.

Thus, viewed from a further aspect the invention provides a composition of matter, in particular a photovoltaic cell, comprising:

at least one nanowire on a graphitic substrate, said at least one nanowire having been grown epitaxially on said substrate wherein said nanowire comprises a bottom portion comprising at least one group III-V compound or at least one group II-VI compound or at least one group IV element which has been doped to form an n-type or p-type semiconductor; and an upper portion comprising at least one group III-V compound or at least one group II-VI compound or at least one group IV element which has been doped such that said upper portion forms a n-type semiconductor or p-type semiconductor opposite to that of the bottom portion.

The nature of the dopants and the materials used to form the nanowires is the same as above. It is be preferred if both top and bottom portions of the nanowire are formed from the same compound, e.g. a group III-V compound such as GaAs.

The junction is preferably placed around half way up the nanowire. The change from n to p type conductivity or vice versa can be achieved simply by changing the nature of the doping atoms. Thus, when the change is desired, supply of the first dopant element is stopped and supply of a second doping element suitable to provide the opposition conductivity is started. This can be readily achieved in the context of the MBE processes described above.

Whilst it is not necessary to provide this axial nip type nanowire with a shell, a shell might aid passivation. Such passivation will act to reduce surface depletion and carrier recombination and thereby increase solar cell efficiency.

As noted above, this axial type junction is preferably used in conjunction with a top contact, especially one formed from a graphitic substrate. That substrate is preferably transparent as it forms a top layer. A plurality of cells of this type could be stacked to form a tandem cell as defined further below. It is also within the scope of the invention for this axial type cell to be used along side a radial core shell cell.

Radial Shell Growth

The grown nanowires are then epitaxially over-grown with a radial shell. This therefore forms a core-shell type arrangement in the nanowire as a whole. The nanowires of the invention may be coated by known methods such as those discussed above in connection with nanowire growth in MBE. The shell should cover all of the core surface.

The shell material will be formed from a group III-V or group II-VI compound or group IV element(s) as described above for the nanowire core. Both core material and shell material need to act as semiconductors in order to produce useful nanowires and hence solar cells. It is most preferred if the core and shell material match in terms of the periodic table. Thus, group III-V nanowire cores preferably have group III-V shells. Group II-VI cores may carry group II-VI shells and so on.

More preferably, at least one of the elements in the core and shell are the same, preferably two elements are the same. In one embodiment, the compound used for core and shell is the same and differs only in the nature of the doping regime.

The shell material needs to be doped so that it forms a p or n junction which is opposite to that formed by the core nanowire. A p-doped core can therefore be covered by an n-doped shell (or vice versa). It is preferred if the core is a p-doped semiconductor whilst the shell is an n-doped semiconductor. A discussion of doping can be found above in connection with the core nanowire.

In one embodiment, when the core nanowire is a group III-V nanowire, then the shell may be a mixed group III-V shell, i.e. comprising two elements from group III and one from group V, e.g. AlGaAs. It will be appreciated that in these ternary (or quaternary) compounds the amount of Al and Ga combined meets the valency of As (subject to doping of course) but that varying amounts of Al and Ga can be present.

The ternary compounds may therefore be of formula XYZ wherein X is a group III element, Y is a group III or V element different from X and Z and Z is a group V element. The X to Y or Y to Z molar ratio in XYZ is preferably 0.2 to 0.8, i.e. the formula is preferably $X_xY_{1-x}Z$ (or $XY_{1-x}Z_x$) where subscript x is 0.2 to 0.8. Quaternary systems may be represented by the formula $A_xB_{1-x}C_yD_{1-y}$ where A and B are group III elements and C and D are group IV elements. Again subscripts x and y are typically 0.2 to 0.8.

An intrinsic (i) undoped layer might also be used in-between the radial p-core and n-shell (or vice versa) structure in order to enhance the solar cell performance. This intermediate layer (i) can be made by initially growing the radial shell undoped before continuing the growth of the doped shell.

It would also be possible to grow a shell in which there was a "p-i-n" or "n-i-p" structure by use of appropriate doping techniques. Thus, initially the shell might be p-doped (covering a p-core nanowire) before an undoped intrinsic shell and n-doped shell is introduced (or vice versa).

Thus, viewed from another aspect the invention provides a composition of matter as hereinbefore defined in which an intrinsic layer (undoped) lies between the core and shell layers. Ideally, the nature of the undoped layer will be the same as that of the core or shell or both, i.e. if the core nanowire is doped GaAs, then the undoped layer is simply undoped GaAs.

Dopants used in the shell are the same as those used in the nanowire and discussed above. Whether the core/shell forms a p or n junction is a function of the nature of the dopant, its amount and so on. The person skilled in the art is familiar with doping of these semiconductor materials in order to introduce p or n type conductivity.

It is particularly preferred if the shell material is an n-type GaAs shell. The core is preferably a p-type GaAs.

The thickness of the shell is of the order of nanometres, e.g. 10 to 500 nm. The shell may be less thick than the nanowire core.

Outer Transparent Conductive Electrode Coating

The use of a two layer core shell nanowire with p and n junctions creates a radial potential for the flow of current. It is necessary of course, to provide electrodes in order to create a cell. The graphitic substrate is a conductor and therefore provides the bottom electrode. It is preferred if the core-shell nanowires are also provided with an outer conductive coating or layer designed to act as a transparent conductive top contact. The presence of this top contact and bottom contact based on the graphitic substrate forms a circuit and therefore allows current to flow in the cell when absorbed photons generate free carriers in the core-shell nanowires.

The outer coating or layer is preferably transparent. This is preferred to allow photons to penetrate the outer coating or layer and be absorbed by the semiconductor core or shell materials within the nanowire. The outer coating or layer must also be a conductor.

In one embodiment, the tip of the shell is contacted with a transparent, conducting graphitic layer such a graphene layer. Ideally this layer should contact as many shell tips as possible. It will be appreciated that where a layer is used, a dielectric material may be required to be inserted between nanowires. The application of a top graphitic layer is discussed in more detail below.

It is preferred if a coating is provided. That coating is preferably formed from a mixed metal oxide. Preferably the coating is formed from a mixed metal oxide of a transition metal or group (III) or (IV) metal. The transition metal is preferably a group 10 to 12 metal. Ideally it is from the first transition series, e.g. Zn. Preferred group (III) or (IV) metals are In, Sn, Al, or Ge.

Coatings of use in the invention therefore include InSnO (Sn-doped InO or ITO) and AlZnO (Al-doped ZnO or AZO).

The outer shell is present to allow high conductance whilst at the same time being transparent. In effect the graphene acts as one electrode and the outer coating acts as a second electrode.

The outer coating can be applied using atomic layer deposition or sputtering.

The thickness of the coating is of the order of nanometres, e.g. 10 to 100 nm. The outer coating should ideally be conformal and as thin as possible but there is a trade-off here between transparency (thin layer) and conductivity (thicker layer).

It will be necessary for the outer coating to cover not only the nanowires but also the substrate on which the nanowires are grown. Of course, it is not possible for the graphitic substrate which forms a bottom contact, to be in direct contact with the top contact formed by the outer shell. It may be necessary therefore to provide an insulating layer on top of the graphitic substrate. Conveniently, this can be achieved using a silica mask as hereinbefore defined.

Nanowires are designed to cover at least 5% of the surface of the graphitic substrate. Ideally coverage can be up to 20% of the graphitic surface. These percentages refer therefore to the surface area under the base of the nanowires. These densities allow for a low light reflection and high photon absorption. Photons are absorbed both by the core and shell components of the nanowire. Without wishing to be limited by theory, in a p-doped core and n-doped shell nanowire, it is envisaged that light will be directed onto the nanowire from above. Photons are absorbed in the nanowire and free charges are generated. The charge carriers are negatively charged electrons and positively charged holes. Electron charges moves through the n-type shell to the top contact. In effect therefore, the electrons can be envisaged as travelling radially in the nanowire to reach the top contact. As the outer coating acts as an electrode, electrons only have to pass a very short distance to the electrode, i.e. the electrons just have to travel through a few 10s of nm of n-type shell before coming into contact with a conductor. The positive charges (hole) passes down the nanowire to the other bottom contact (graphitic substrate) base layer and charges passes very rapidly down the nanowire to the contact.

The nature of the top contact design might depend on the system. If problems with surface states arise it might be important to have a passivation layer outside the radial semiconductor shell, and instead only have the top contact in direct contact with the semiconductor shell at the top part of the nanowire. Such radial passivation layer may be introduced by chemical passivation (e.g. using an ammonium sulphide solution) or by overgrowing the doped nanowire shell with an undoped (intrinsic) epitaxial window layer (e.g. an AlGaAs window layer for a GaAs nanowire shell). The nanowires can then be embedded in an transparent insulator (e.g. benzocyclobutene resin(BCB)), before a transparent conductive top contact (e.g. ITO or AZO) is made to attach to the conductive part of the nanowire tips. A discussion of passivation of GaAs nanowires can be found in Nano Lett, 2011, 11, 2490-2494 Mariani et al).

Having such short distances for electrons to travel means that electron collection time can be shorter than the electron thermalization time, and that the cells of the invention therefore can be very efficient. Efficiencies above 34% are possible.

It is also possible to supplement the outer coating contact by providing a further metallic top contact on the cell. The metallic top contact is preferably gold or a metal or alloy of typical electrode type metals such as Pt, Pd, Ti, Ge, and Au.

In this way, the top contact is formed from the outer coating which is also in contact with the metallic top contact. Charge can pass rapidly down the conducting outer coating to the top contact.

It will be appreciated that the photons absorbed by a particular core shell nanowire will depend on the band gap of the materials in question. The band gap generally refers to the energy difference (in electron volts) between the top of the valence band and the bottom of the conduction band. This is equivalent to the energy required to take an electron from the top of the valence band to the bottom of the conduction band so that it becomes a mobile charge carrier, able to move freely within the semiconductor material. So the band gap is a major factor determining the minimum energy needed for photons in order to create free carriers in the semiconductor.

Photons with energies less than the bandgap will not be able to create any free carries in the semiconductor, and thus not absorb any light. Free carriers that have been created with photons larger than the bandgap, will loose part of their energy to heat (the amount equivalent to the difference between the photon energy and the bandgap energy). The efficiency of the solar cell is thus strongly dependent on the bandgap of the material.

By manipulating the chemical composition of the semiconductor materials in the core and shell nanowire, materials having different band gaps can be produced.

Stacking Cells/Tandem Cells

In order to maximise performance in a solar cell, it is important to absorb as many photons as possible. The nature of the photons which a particular cell will absorb, and how much electric power the cell can generate, is to large degree dictated by the band gap. The size of the band gap is a function of the core and shell layers and can therefore be varied depending on the nature of the materials used. The inventors envisage therefore that a plurality of different cells as hereinbefore defined can be used to form solar cells which absorb photons across a breadth of wavelengths. By providing cells with different band gaps, each cell will absorb photons from a different part of the solar spectrum from those of other cells. This maximises the performance of the solar cell as it allows less heat loss and a broader spectrum of photons to be absorbed. Combining a plurality of these different cells should enable the formation of a highly efficient solar cell.

Viewed from another aspect therefore the invention provides a solar cell comprising at least two cells as hereinbefore defined having different band gaps. These are called tandem cells herein.

Cells should absorb light of different wavelengths to each other, e.g. blue light and red light.

There is no particular limitation on the arrangement of cells within a device. However, it is envisaged that the cells can literally be stacked on top of each other. The nanowire growing process tends to produce nanowires of the same length. The top surface of a cell is therefore mostly flat. Therefore the bottom of a cell above can sit upon the top of the cell below. It is therefore important that the bottom contact of the top cell is transparent to allow photons to penetrate to the solar cell below. An insulator (or air gap) should also be present between stacked cells.

In one embodiment therefore, a top cell could absorb blue light photons. A lower cell might absorb red light photons. The nature of the photons absorbed is determined by the band gap. It is preferred to have the lower band gap material in the bottom cell in a stack. The stacking order from bottom to top preferably reflects the band gap—lowest to highest.

It is not necessary for the nanowires in the stacking cells to align.

There is no reason of course, to limit the solar cell to visible light. E.g. GaSb nanowires have lower band gap and will absorb IR photons.

It is preferred that in use the nanowires are oriented to be parallel to the direction of the sun light in the solar cell. Light therefore mostly passes down the length of the nanowires and not across the nanowires radially. The use of a light collector like a lens to focus light into the cell may be an option as is done in concentrated photovoltaic (CPV) applications.

Each cell can be 1 to 2 microns long so tandem cells may be 2 to 4 microns and triple cells can be 3 to 6 microns in height.

It is also possible to use a cell of the present invention in combination with other designs of solar cell such as a traditional thin-film p-n junction cell. In particular, it is also possible to make a double (ideally based on a $1^{st}$ low band gap cell and a $2^{nd}$ high band gap cell) junction tandem cell without stacking by using graphene as a common intermediate (conductive and transparent) layer with the two active cells connected in parallel or series.

By having the two cells connected in parallel (series) with a common intermediate graphene layer, the short circuit current (open circuit voltage) can be added from each cell independently. In the parallel configuration, it would also be possible to "disconnect" the connection between top and bottom contacts and operate the upper and lower cells independently with different voltages across each cell, but still with the common intermediate layer as common contact. In this case, there is no insulation layer (or air gap) between the two cells.

This is particularly advantageous for the parallel connected cells since a high solar cell efficiency can be achieved without the requirement for current matching that would be needed when the two cells are connected in series (as in traditional multi junction tandem cells).

The $1^{st}$ cell (low band gap) can be a traditional thin-film p-n junction cell, with transferred graphene on the top that serves as both the common intermediate layer (i.e. the top electrode for the 1st cell) as well as the substrate for the growth of the top nanowire core-shell solar cell ($2^{nd}$ cell). It also acts obviously as an electrode for the second cell too.

Thus, viewed from another aspect the invention provides a composition of matter, in particular a tandem photovoltaic cell, comprising:

(A) at least one core semiconductor nanowire on a graphene layer, said at least one core nanowire having been grown epitaxially on said graphene layer wherein said nanowire comprises at least one group III-V compound or at least one group II-VI compound or at least one group IV element;

a semiconductor shell surrounding said core nanowire, said shell comprising at least one group III-V compound or at least one group II-VI compound or at least one group IV element such that said core nanowire and said shell form an n-type semiconductor and a p-type semiconductor respectively or vice versa; and an outer conducting coating surrounding said shell which forms an electrode contact; or an outer conducting layer which contacts the top of the semiconductor shell on said nanowire and which forms an electrode, e.g. a transparent graphitic layer such as graphene; and (B) a thin-film p-n junction cell having a bottom electrode and a top electrode;

where said graphene layer serves as the top electrode for the thin-film p-n junction cell.

Ideally therefore the graphene layer forms a transparent bottom electrode and "substrate" for nanowire growth whilst acting as a top electrode for the thin film junction cell. The graphene layer should be transparent to let light through to the cell below.

It will be appreciated that this tandem cell could then additionally comprise a further stacking cell on top and so on. Thus a cell of the invention could be stacked on the top layer of this tandem cell to provide a triple cell structure. A dielectric layer or air gap might be used between the stacked cell and the tandem cell as necessary.

Graphitic Top Layer

In a further possible embodiment of the invention, cells can be provided with a graphitic top layer. A graphitic layer can be placed on top of the formed radial p/n junction core shell and coated nanowires or axial p/n junction nanowire. This obviously forms a top contact with the nanowire. It is preferred that the graphitic top layer is substantially parallel with the substrate layer. It will also be appreciated that the area of the graphitic layer does not need to be the same as the area of the substrate. It may be that a number of graphitic layers are required to form a top layer.

The graphitic layers used can be the same as those described in detail above in connection with the substrate. The top layer is graphitic, more especially it is graphene.

It is preferred if the top layer is 20 nm in thickness or less. Even more preferably, the graphitic top contact may be 5 nm or less in thickness.

Application of the top contact to the formed nanowires can be achieved by any convenient method. Methods akin to those mentioned previously for transferring graphitic layers to substrate carriers may be used. The graphitic layers from Kish graphite, highly ordered pyrolytic graphite (HOPG), or CVD may be exfoliated by mechanical or chemical methods. Then they can be transferred into etching solutions such as HF or acid solutions to remove Cu (Ni, Pt) (especially for CVD grown graphitic layers) and any contaminants from the exfoliation process. The etching solution can be further exchanged into other solutions such as deionised water to clean the graphitic layers. The graphitic layers can then be transferred onto the formed nanowires as the top contact. Again e-beam resist or photoresist may be used to support the thin graphitic layers during the exfoliation and transfer processes, which can be removed after deposition.

It is preferred if the graphitic layers are dried completely after etching and rinsing, before they are transferred to the top of the nanowire arrays. To enhance the contact between graphitic layers and nanowires a mild pressure and heat can be applied during this "dry" transfer.

Alternatively, the graphitic layers can be transferred on top of the nanowire arrays, together with a solution (e.g. deionised water). As the solution dries off, the graphitic layers naturally form a close contact to underlying nanowires. In this "wet" transfer method, the surface tension of the solution during the drying process might bend or knock out the nanowire arrays. To prevent this, where this wet method is used, more robust nanowires are preferably employed. Nanowires having a diameter of >200 nm might be suitable. Alternatively, hole patterned substrates which support the vertical nanowire structure could be used. One may also use the critical-point drying technique to avoid any damage caused by surface tension during the drying process.

If there is a water droplet on a nanowire array and attempts to remove it involve, for example a nitrogen blow, the water drop will become smaller by evaporation, but the drop will always try to keep a spherical form due to surface tension. This could damage or disrupt the nanostructures around or inside the water droplet.

Critical point drying circumvents this problem. By increasing temperature and pressure, the phase boundary between liquid and gas can be removed and the water can be removed easily.

The top contact graphitic layer is preferably transparent, conductive and flexible. To enhance the electrical and mechanical contact of the graphitic layers to the metal particles on top of as-grown nanowires further, a post-annealing process may be used. After the deposition of the graphitic top contact, the sample can be annealed in an inert atmosphere, e.g. of argon, or vacuum. Temperatures can be up to 600° C. Annealing times can be up to 10 min.

Also doping of the graphitic top contact can be utilized. The major carrier of the graphitic top contact can be controlled as either holes or electrons by doping. It is preferable to have the same doping type in the graphitic top contact and in the semiconducting nanowires. For example, a core-shell nanowire with p-doping in the shell should be matched with p-doping of the top graphitic layers. An axial p/n junction nanowire with p-doping at the upper part of the nanowire should be matched with p-doping of the top graphitic layers. To enhance the conductivity of the graphitic top contact, metallic nanostructures such as nanowires and nanoparticles with high conductivity ($>10^3$ S/cm) can be dispersed on top, in particular in such a way that they are partly interconnected e.g. a Ag nanowire/graphene hybrid top contact

APPLICATIONS

The nanowires of the invention can be used in the manufacture of solar cells. Such solar cell has the potential to be efficient, cheap and flexible at the same time.

The invention will now be further discussed in relation to the following non limiting examples and figures.

BRIEF DESCRIPTION OF THE FIGURES

FIG. 6b shows a SEM image of GaAs nanowire arrays covered with a graphene layer deposited on top. The nanowire arrays were grown as in FIG. 6a.

FIG. 6c shows a magnified SEM image of GaAs nanowire arrays with a graphene layer partially deposited on top. The nanowire arrays were grown as in FIG. 6a.

Figure 1A:
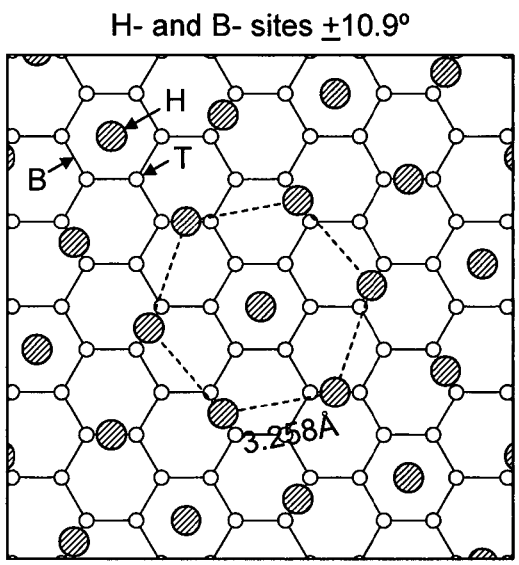
FIG. 1a-d shows the atomic arrangements when atoms are placed on 1) H- and B-sites (FIG. 1a, b, and d), and 2) H- or B-sites (FIG. 1c).
Figure 1B:
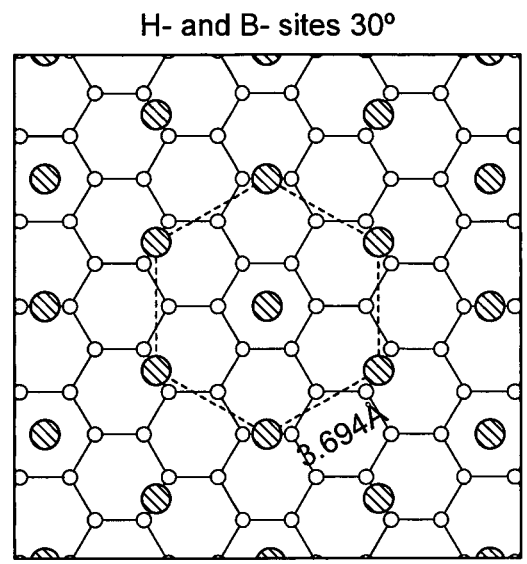
Figure 1C:
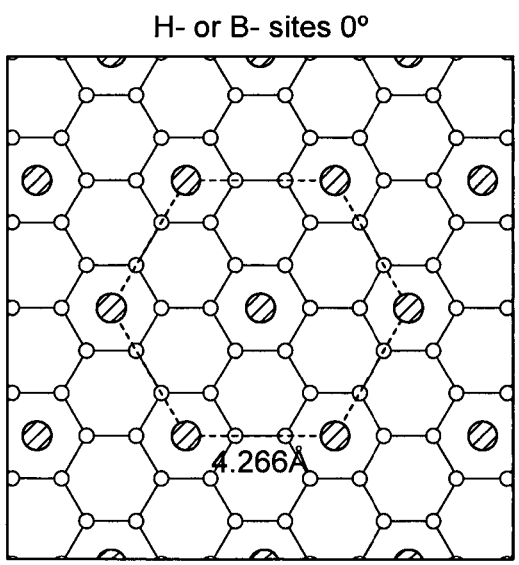
Figure 1D:
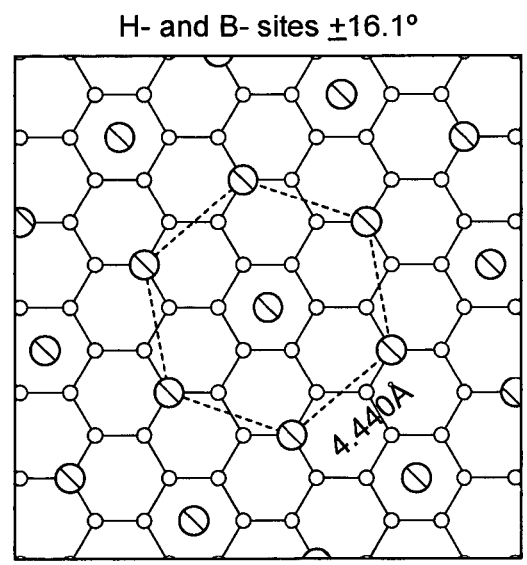
Figure 1E:
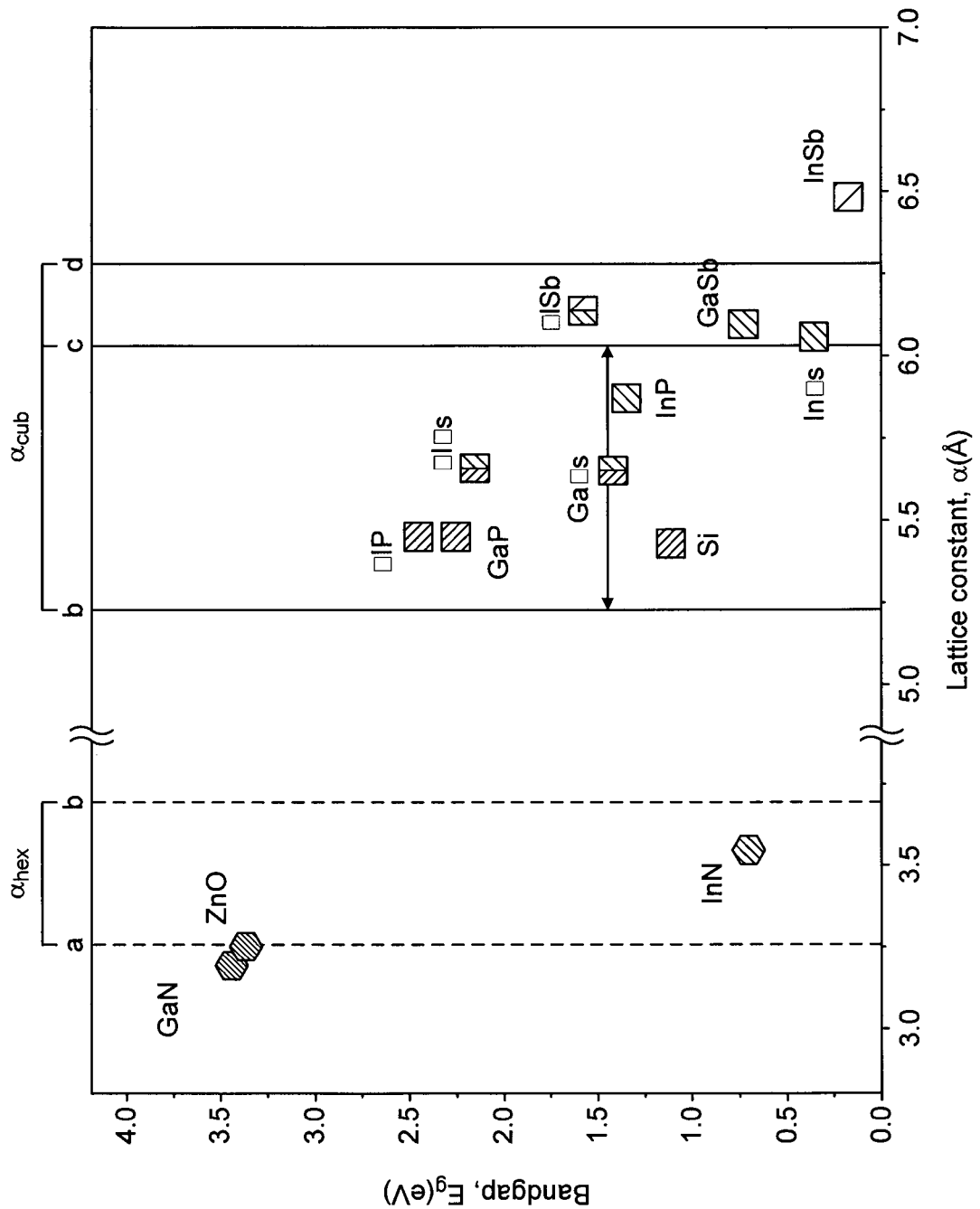
In FIG. 1e the bandgap energies of the III-V semiconductors (as well as Si and ZnO) are plotted against their lattice constants. Vertical solid (dashed) coloured lines depict the lattice constant of an ideal crystal that would give perfect lattice match with graphene for a cubic (hexagonal) crystal with the four different atomic arrangements (FIG. 1a-d) with respect to graphene. The plot visualizes the vast possibilities for epitaxial growth of vertical semiconductor nanowires on graphitic substrates. In the case of some semiconductors, the lattice mismatch with graphene is very small (e.g. InAs, GaSb, and ZnO) for one suggested atomic configuration. For other semiconductors like GaAs, the lattice mismatch is quite large and in-between two different atomic configurations (as in FIG. 1b or FIG. 1c).
Figure 2:
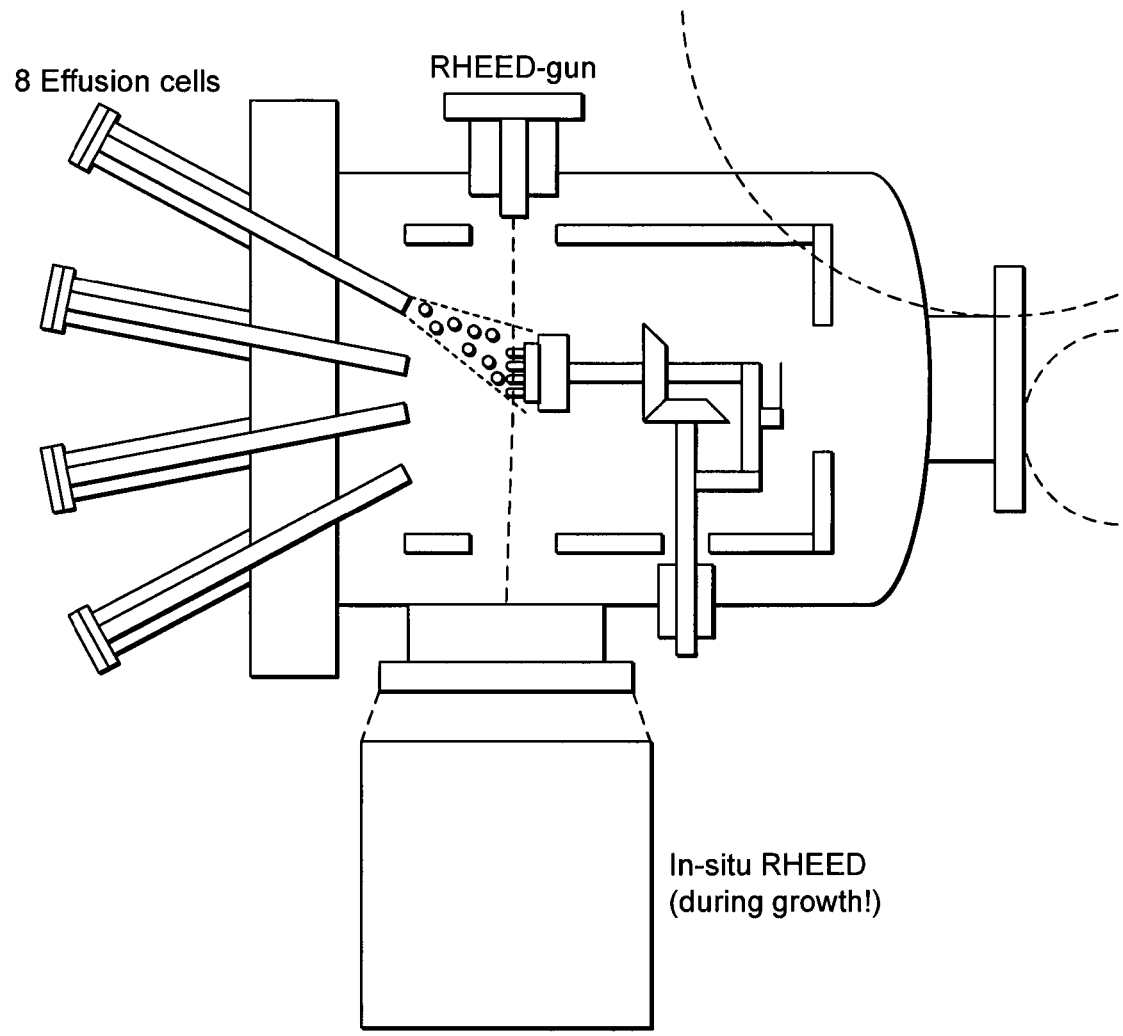
FIG. 2 shows a MBE experimental set up.
Figure 3A:
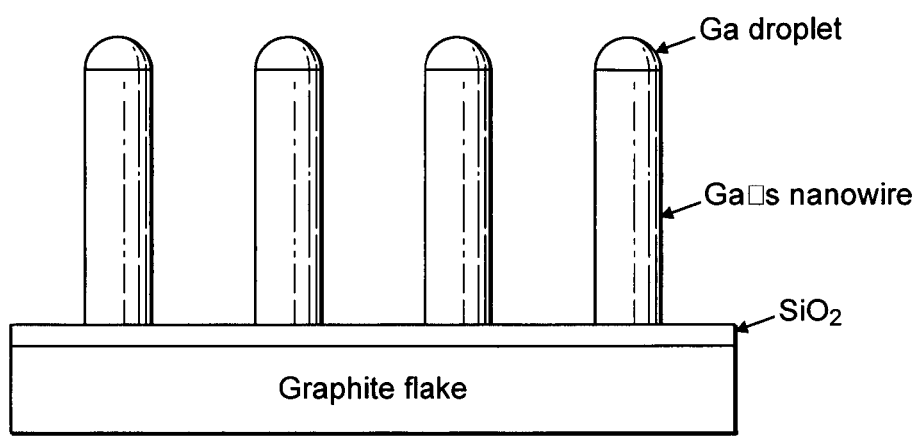
FIG. 3a is an idealized depiction of Ga (self) catalysed GaAs nanowires grown on graphite.
Figure 3B:
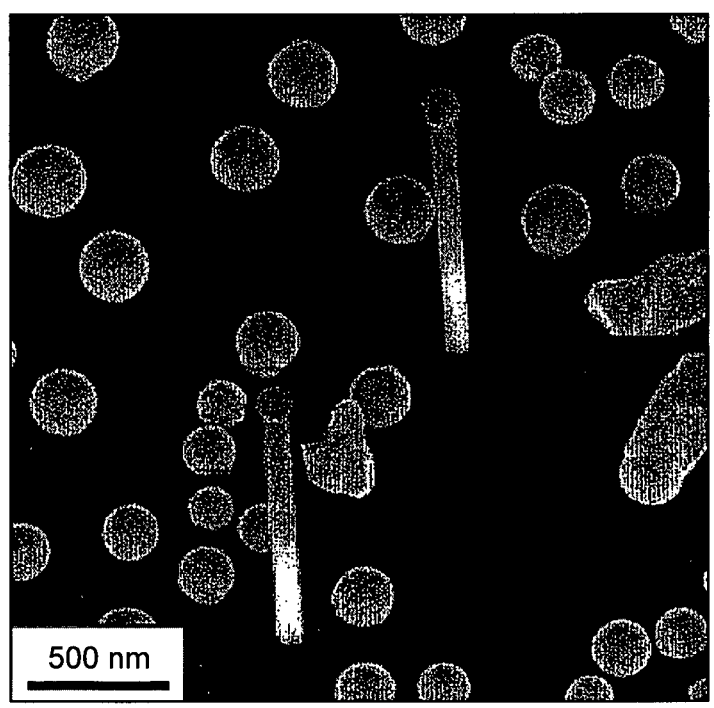
FIG. 3b is a 45° tilted view SEM image of two vertical Ga assisted GaAs nanowires grown by MBE on a flake of Kish graphite. The spherical particles are Ga droplets.
Figure 3C:
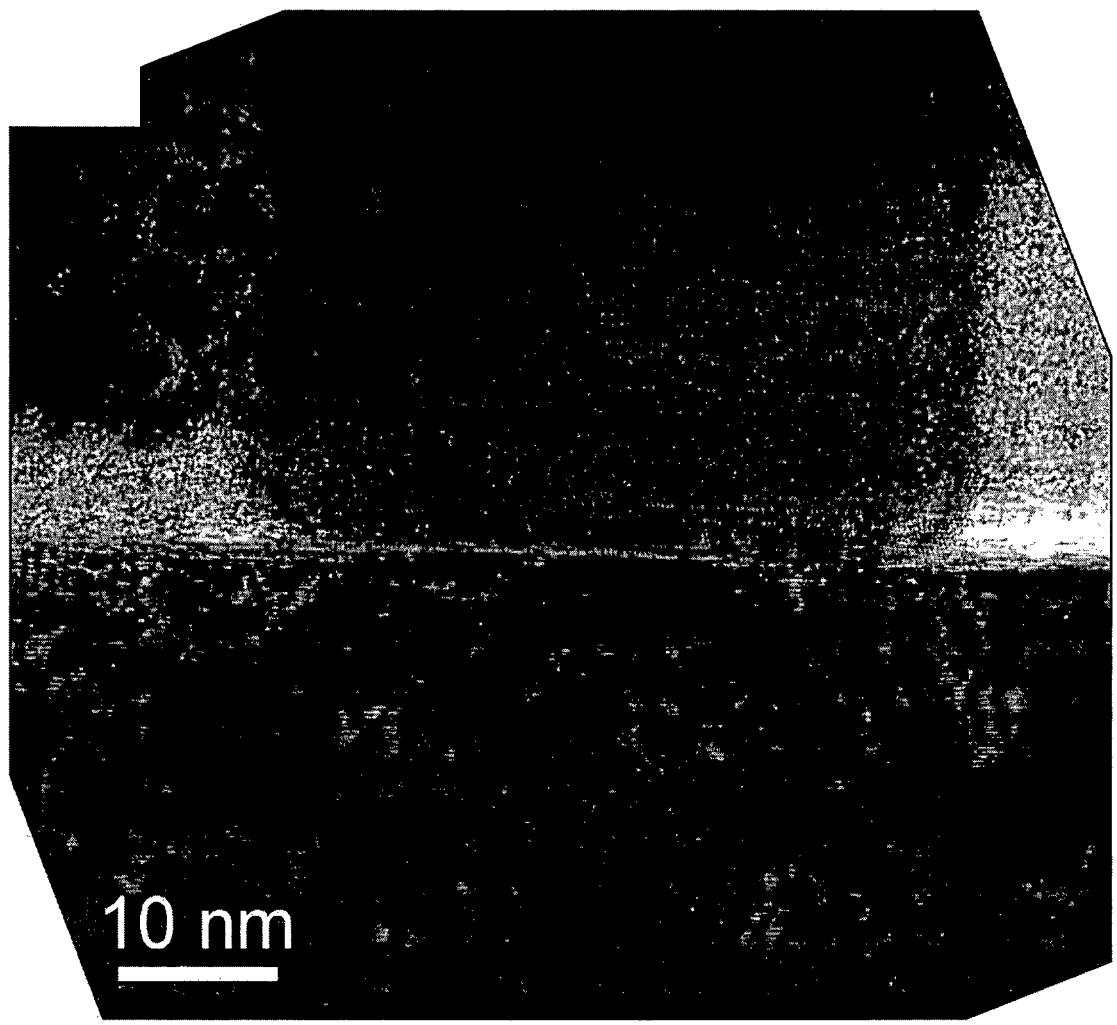
FIG. 3c is a cross sectional TEM image of the graphite/nanowire interface of a vertical Ga-assisted GaAs nanowire grown epitaxially on top of Kish graphite.
Figure 4:
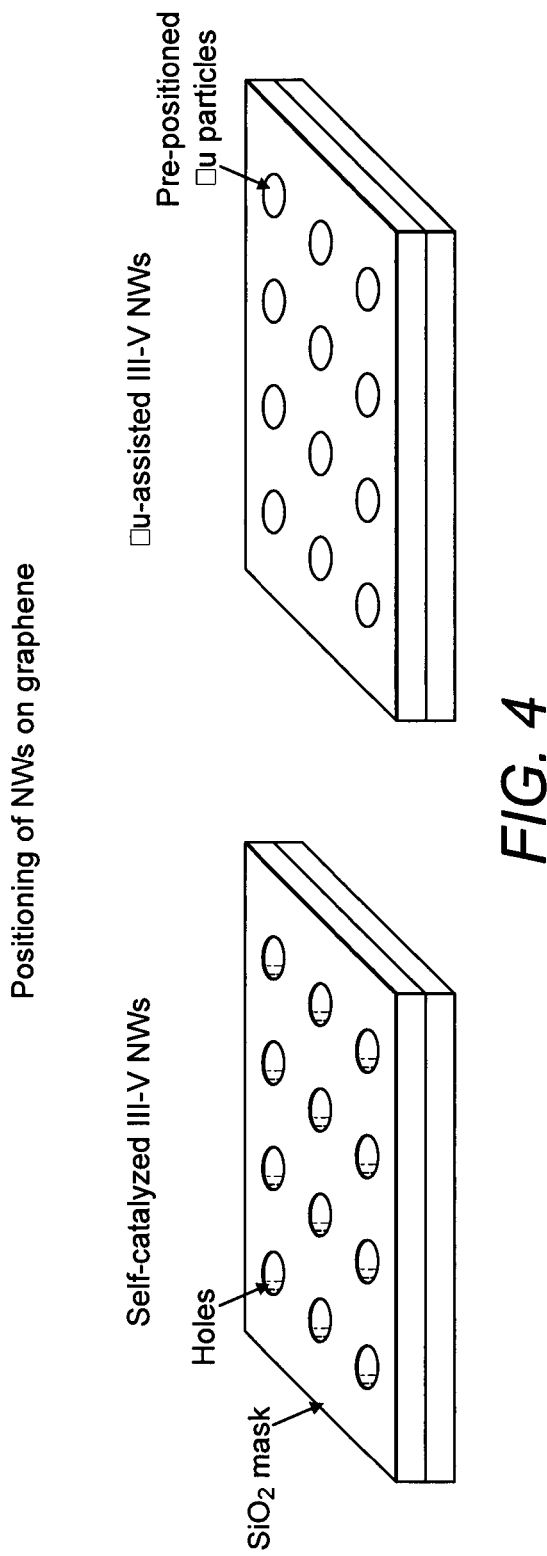
FIG. 4 shows a depiction of a mask on the graphite surface, which has been etched with holes.
Figure 5A:
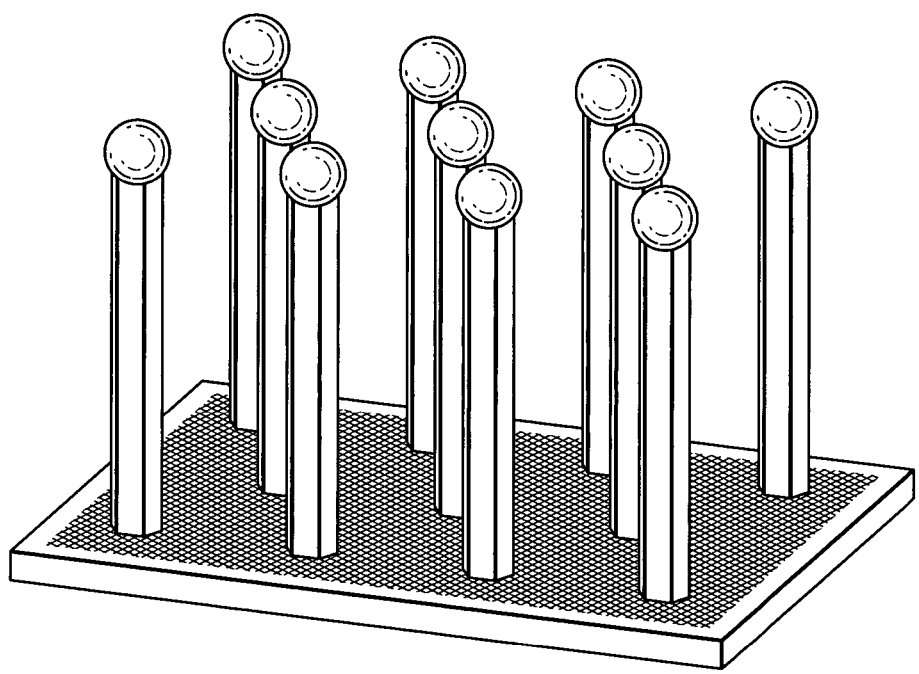
FIG. 5a shows a schematic image of semiconducting nanowires grown by a metal catalyst-assisted vapour-liquid-solid (VLS) method. The substrate is graphene deposited on a $SiO_2$ substrate.
Figure 5B:
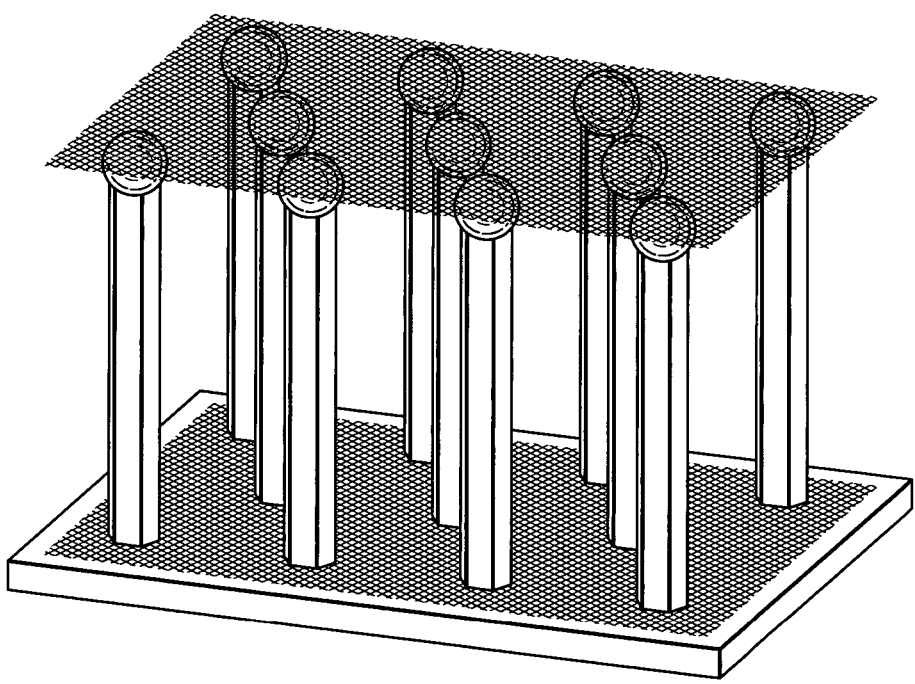
FIG. 5b shows a schematic image as in FIG. 5a but here with graphene as a top contact material. It can be also envisaged as a nanowire solar cell with the two graphene layers as the two terminals.
Figure 6A:
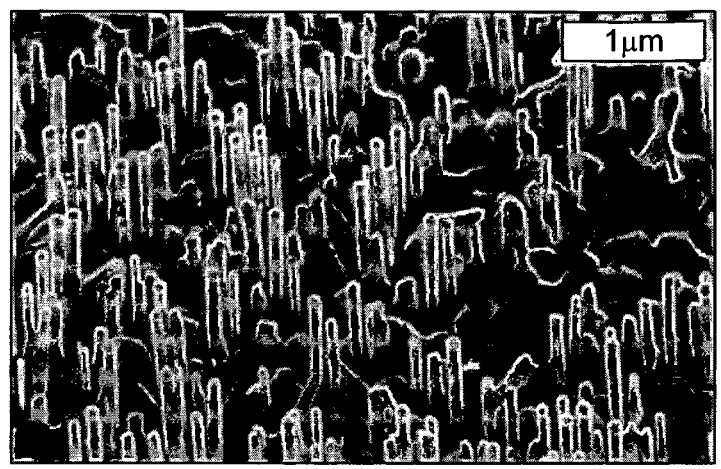
FIG. 6a shows a tilted view SEM image of Ga-assisted GaAs nanowire arrays grown on a Si(111) substrate by MBE.
Figure 6B:
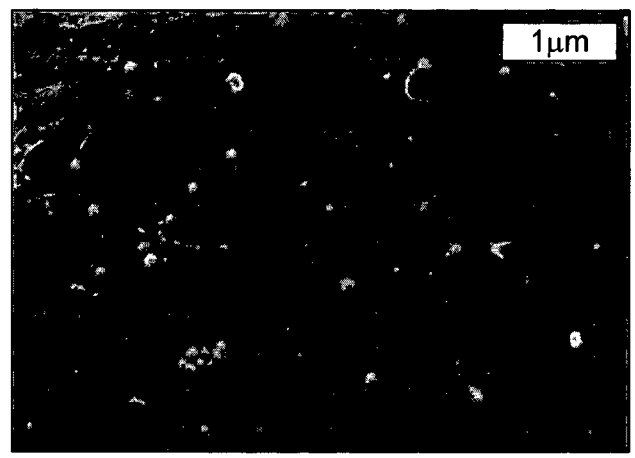
Figure 6C:
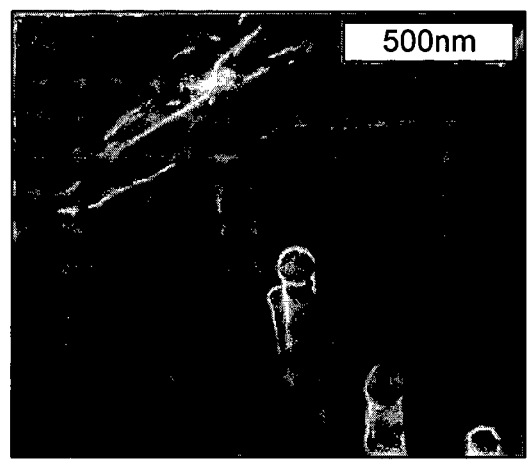
Figure 7:
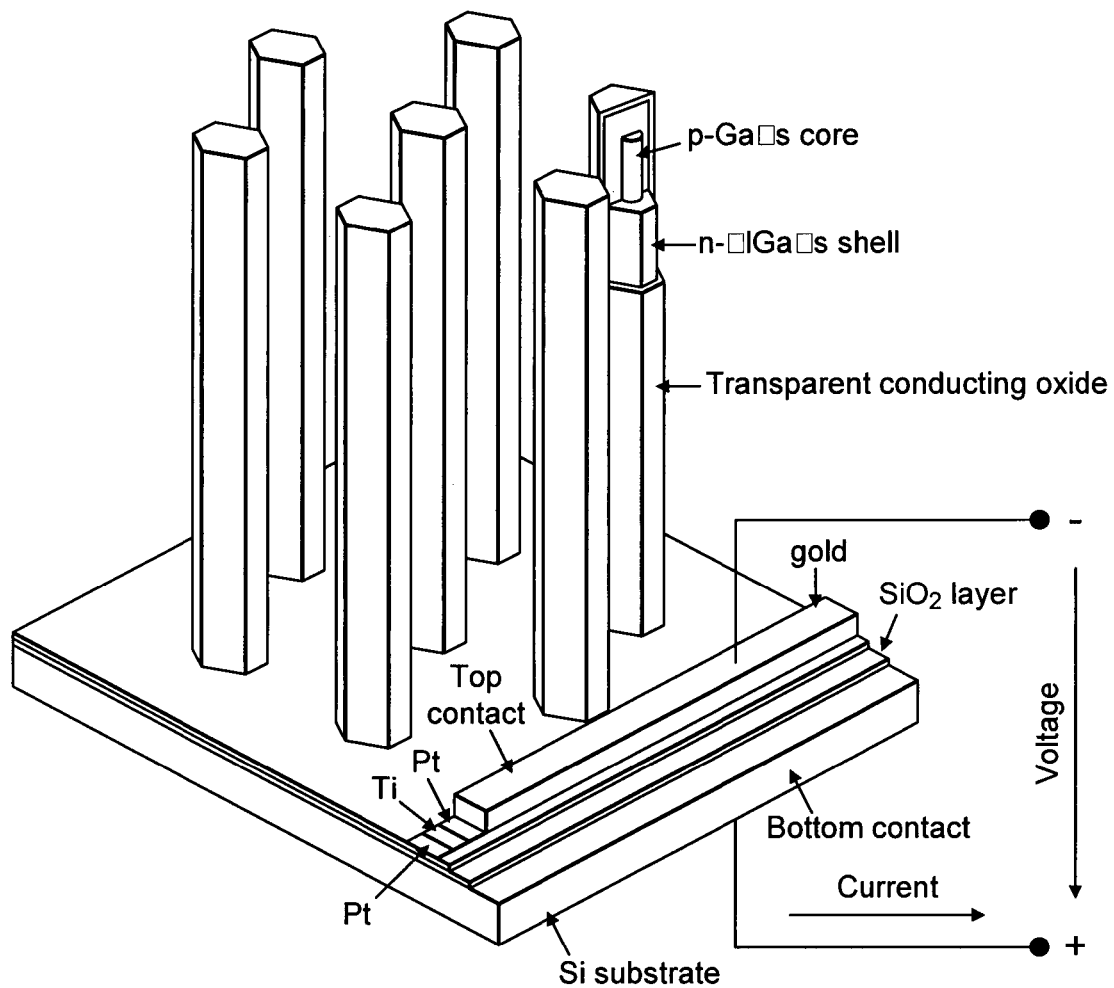
FIG. 7 is a schematic depiction of a radial core-shell nanowire solar cell of the invention. Nanowires are grown epitaxially on a graphene substrate provided with a silica mask. The carrier material is metal foil or glass. The nanowire core is GaAs, the shell material is AlGaAs and an AlZnO top coating is used.
Figure 8:
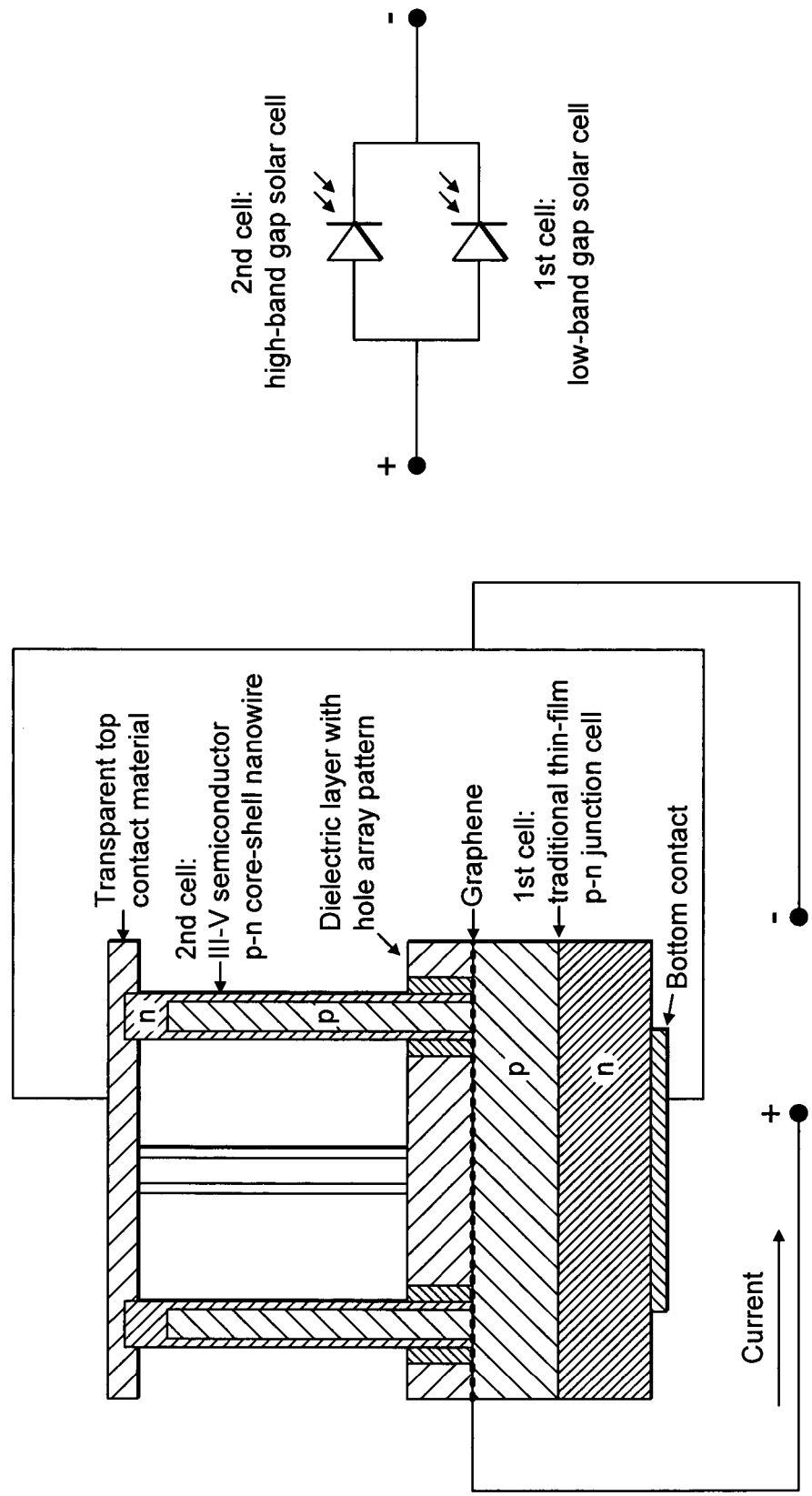
FIG. 8 is a schematic of a double junction solar cell structure using graphene as a common intermediate layer where the two active layers are connected in parallel. The 1st active low band gap material can be any semiconductor solar cell material e.g. a Si based n-p junction solar cell. The 2nd active high band gap material on top of the 1st cell is composed of graphene as a common (either common p-type or common n-type contact can be used) intermediate contact for both cells, the p-n core-shell III-V semiconductor nanowire array on the graphene, and a top transparent conducting layer. The top conducting layer can be any transparent conducting material including graphene.

The invention will now be described with reference to the following non limiting examples.

EXAMPLE 1

Experimental Procedure:

Nanowires were grown in a Varian Gen II Modular molecular beam epitaxy (MBE) system equipped with a Ga dual filament cell, an In SUMO dual filament cell, an Al cell, and an As valved cracker cell, allowing to fix the proportion of dimers and tetramers. In the present study, the major species of arsenic were $As_4$ or $As_2$. Growth of NWs is performed either on a Kish graphite flake or on a graphene film (1 to 7 monolayers thick) grown by a chemical vapor deposition (CVD) technique directly on a Ni or Cu film deposited on an oxidized silicon wafer. The CVD graphene films were bought from "Graphene Supermarket", USA. The samples were prepared using two different procedures. In the first procedure, the samples were cleaned by iso-propanol followed by a blow dry with nitrogen, and then In-bonded to the silicon wafer. In the second procedure, a ~30 nm thick $SiO_2$ layer was deposited in an electron-beam evaporator chamber on the samples prepared using the first procedure where after holes of ~100 nm in diameter were fabricated in the $SiO_2$ using electron-beam lithography and plasma etching.

The samples were then loaded into the MBE system for the nanowire growth. The substrate temperature was then increased to a temperature suitable for GaAs/InAs nanowire growth: i.e. 610° C./450° C., respectively. The Ga/In flux was first supplied to the surface during a time interval typically in the range 5 s to 10 minutes, dependent on Ga/In flux and desired droplet size, while the As shutter was closed, to initiate the formation of Ga/In droplets on the surface. GaAs/InAs nanowire growth was initiated by simultaneously opening the shutter of the Ga/In effusion cell and the shutter and valve of the As effusion cell. The temperature of the Ga/In effusion cell was preset to yield a nominal planar growth rate of 0.1 µm per hour. To form the GaAs nanowires, an $As_4$ flux of $1.1 \times 10^{-6}$ Torr is used, whereas the $As_4$ flux is set to $4 \times 10^{-6}$ Torr to form InAs nanowires.

For p-type doping of GaAs core nanowires beryllium (Be) was used. The Be cell temperature was set to 990° C. which gives a nominal p-type doping concentration of $3 \times 10^{18}$ $cm^{-3}$. With the conditions mentioned above, the nanowire growth was done for a duration of 3 hours and the growth was stopped by closing all the shutters, and simultaneously ramping down the substrate to room temperature. For n-type doping of GaAs core nanowires, tellurium (Te) was used with the cell temperature 440° C., which corresponds to nominal n-type doping concentration of $4 \times 10^{18}$ $cm^{-3}$. The Te doped GaAs nanowires were grown at substrate temperature 580° C. and with an As flux of $8 \times 10^{-7}$ Torr. All other conditions were the same as used for the Be doped nanowires.

Finally, Be doped GaAs p-core with a Si doped GaAs n-shell, as well as Te doped GaAs n-core with an Be doped GaAs p-shell were also grown. After growing the Be doped GaAs p-core, the Ga droplet was consumed into nanowire material by implementing a growth interruption of 10 min where the Ga shutter was closed and the As flux was increased to $1 \times 10^{-5}$ Torr. To grow Si doped n-type GaAs shell, the substrate temperature was reduced to 540° C. and the As flux was increased to $1.5 \times 10^{-5}$ Torr. When the shutters were opened, growth took place only on the side-facets of the GaAs core creating a core-shell structure. The GaAs shell growth was done for a duration of 1 hour with the Si cell temperature 1295° C., which would produce a nominal n-type doping concentration of $1 \times 10^{18}$ $cm^{-3}$. In the case of Te doped GaAs core and Be doped GaAs shell, the substrate temperature was increased to 610° C. for the shell growth and the used As flux was $4 \times 10^{-6}$ Torr.

EXAMPLE 2

Axial p/n Junction

Axial p-n and n-p junction GaAs core nanowires were grown by using Be as the p-dopant and Te as the n-dopant. Using the same growth conditions as example 1, GaAs p (n)-core was grown for a duration of 1.5 hours. Then the Be (Te) shutter was closed and the Te (Be) shutter was opened to switch dopant and the growth was continued for 1.5 hours

EXAMPLE 3

Transparent Electrode Contact Coating

A final conformal capping of the MBE grown nanowires with a transparent contact was made by depositing Al-doped ZnO (AZO) using atomic layer deposition (ALD). For the ALD trimethylaluminum, diethylzinc, and de-ionized water were used as precursors at a pressure of 50 mTorr and a temperature of 200° C., in a customized flow-type reactor with an argon carrier gas at a flow rate of 10 sccm.

EXAMPLE 4

Experimental Procedure for Transferring the Graphitic Layers on Top of Nanowire Arrays Graphitic layers (<5 layers) grown on Cu foils were used. Since graphitic layers are formed on both sides of Cu foil during CVD growth, the graphitic layers formed on one side were removed by oxygen plasma to expose the Cu for etching. This was then dipped in a dilute iron nitrate ($Fe(NO_3)_3$) solution (<5%) to etch Cu away completely. After etching overnight (>8 hrs), the graphitic layers were floated on the etching solution, which were exchanged into deionised water. After further rinsing with deionised water several times, the graphitic layers were transferred on the nanowire arrays with deionised water. Deionised water was dried naturally in a clean room without any $N_2$ blow.

The invention claimed is:

1. A tandem photovoltaic cell, comprising:
   (A) at least one core semiconductor nanowire on a graphene layer, said at least one core semiconductor nanowire having been grown epitaxially on said graphene layer wherein said at least one core semiconductor nanowire comprises at least one group III-V compound;
   a semiconductor shell surrounding said at least one core semiconductor nanowire, said semiconductor shell comprising at least one group III-V compound such that said at least one core semiconductor nanowire and said semiconductor shell form an n-type semiconductor and a p-type semiconductor respectively or vice versa; and an outer conducting coating surrounding said semiconductor shell which forms an electrode contact; or an outer conducting layer which contacts the top of the semiconductor shell on said at least one core semiconductor nanowire and which forms an electrode; and (B) a thin-film p-n junction cell having a bottom electrode and a top electrode;

where said graphene layer serves as the top electrode for the thin-film p-n junction cell.

2. The tandem photovoltaic cell of claim 1, further comprising a second photovoltaic cell stacked thereon.

3. The tandem photovoltaic cell as claimed in claim 1, wherein said at least one core semiconductor nanowire comprises AlAs, GaSb, GaP, GaN, GaAs, InP, InN, InAs, InGaAs, or AlGaAs.

4. The tandem photovoltaic cell as claimed in claim 1, wherein the graphene layer comprises 10 or fewer graphene sheets.

5. The tandem photovoltaic cell as claimed in claim 1, wherein the graphene layer is a CVD-grown graphene layer on a metallic film or foil.

6. The tandem photovoltaic cell as claimed in claim 1, wherein the graphene layer is doped with a dopant and the at least one core semiconductor nanowire is doped with the same dopant.

7. The tandem photovoltaic cell as claimed in claim 1, wherein the graphene layer is doped by adsorption of organic or inorganic molecules.

8. The tandem photovoltaic cell as claimed in claim 1, wherein a surface of the graphene layer is doped by a substitutional doping method during its growth with incorporation of dopants.

9. The tandem photovoltaic cell as claimed in claim 1, wherein a plurality of the at least one core semiconductor nanowires are disposed on the graphene layer and wherein said plurality of the at least one core semiconductor nanowires are substantially parallel.

10. The tandem photovoltaic cell as claimed in claim 1, wherein said at least one core semiconductor nanowire is grown in the presence of a catalyst.

11. The tandem photovoltaic cell as claimed in claim 1, wherein said at least one core semiconductor nanowire is a p-type semiconductor and said semiconductor shell is an n-type semiconductor.

12. The tandem photovoltaic cell as claimed in claim 1, wherein an undoped layer is present between said at least one core semiconductor nanowire and said semiconductor shell.

13. The tandem photovoltaic cell as claimed in claim 1, further comprising a plurality of additional photovoltaic cells stacked vertically thereon.

14. The tandem photovoltaic cell as claimed in claim 13, wherein the plurality of additional photovoltaic cells each have a different band gap.

* * * * *